(12) United States Patent
Lin et al.

(10) Patent No.: US 12,133,392 B2
(45) Date of Patent: Oct. 29, 2024

(54) MEMORY DEVICE AND FORMING METHOD THEREOF

(71) Applicant: TAIWAN SEMICONDUCTOR MANUFACTURING COMPANY, LTD., Hsinchu (TW)

(72) Inventors: Meng-Han Lin, Hsinchu (TW); Chia-En Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 109 days.

(21) Appl. No.: 17/718,071

(22) Filed: Apr. 11, 2022

(65) Prior Publication Data
US 2023/0328998 A1 Oct. 12, 2023

(51) Int. Cl.
| | |
|---|---|
| H01L 29/06 | (2006.01) |
| H01L 21/28 | (2006.01) |
| H01L 29/51 | (2006.01) |
| H01L 29/66 | (2006.01) |
| H01L 29/78 | (2006.01) |
| H10B 51/20 | (2023.01) |
| H10B 51/30 | (2023.01) |

(52) U.S. Cl.
CPC ........ *H10B 51/30* (2023.02); *H01L 29/40111* (2019.08); *H01L 29/516* (2013.01); *H01L 29/6684* (2013.01); *H01L 29/78391* (2014.09); *H10B 51/20* (2023.02); *H01L 29/66795* (2013.01); *H01L 29/7855* (2013.01)

(58) Field of Classification Search
CPC ............ H01L 29/40111; H01L 29/516; H01L 29/6684; H01L 29/78391; H01L 29/66795; H01L 29/7855; H10B 51/20
USPC .......................................................... 257/3
See application file for complete search history.

(56) References Cited

U.S. PATENT DOCUMENTS

| | | | |
|---|---|---|---|
| 2004/0061153 A1* | 4/2004 | Misewich | H10B 51/00 257/295 |
| 2015/0221666 A1* | 8/2015 | Lee | H01L 29/66833 257/329 |
| 2015/0221667 A1* | 8/2015 | Fukuzumi | H01L 29/7926 257/314 |
| 2019/0148406 A1* | 5/2019 | Liu | H01L 23/528 257/295 |
| 2019/0181147 A1* | 6/2019 | Liu | H01L 29/78642 |
| 2020/0027897 A1* | 1/2020 | Zhu | H10B 53/20 |
| 2020/0083248 A1* | 3/2020 | Uchida | H10B 43/27 |
| 2020/0212068 A1* | 7/2020 | Lee | H01L 29/66666 |
| 2020/0212224 A1* | 7/2020 | Penumatcha | H01L 29/41725 |
| 2020/0227439 A1* | 7/2020 | Sato | H10B 51/10 |
| 2020/0227727 A1* | 7/2020 | Li | H10B 51/20 |
| 2020/0343266 A1* | 10/2020 | Reznicek | H01L 29/04 |
| 2020/0357927 A1* | 11/2020 | Hsieh | H01L 29/66545 |
| 2021/0036162 A1* | 2/2021 | Rigano | H01L 29/4908 |

(Continued)

*Primary Examiner* — Sheikh Maruf
(74) *Attorney, Agent, or Firm* — Maschoff Brennan

(57) ABSTRACT

A memory device comprises a word line, a gate dielectric layer, a semiconductor layer, a source line, and a resistance-switchable element. The word line is over a substrate. The gate dielectric layer is on a sidewall of the word line. The semiconductor layer is on a sidewall of the gate dielectric layer. The source line is in contact with a first region of a sidewall of the semiconductor layer. The resistance-switchable element is in contact with a second region of the sidewall of the semiconductor layer.

20 Claims, 25 Drawing Sheets

(56) References Cited

U.S. PATENT DOCUMENTS

| | | | | |
|---|---|---|---|---|
| 2021/0066344 A1* | 3/2021 | Son | .................... | H01L 29/4916 |
| 2021/0217775 A1* | 7/2021 | Zhang | ............... | H01L 29/40111 |
| 2021/0358925 A1* | 11/2021 | Takahashi | .............. | H10B 51/20 |
| 2022/0005821 A1* | 1/2022 | Or-Bach | ................ | H10B 41/27 |
| 2022/0068722 A1* | 3/2022 | Calabrese | .............. | H10B 12/05 |
| 2022/0157966 A1* | 5/2022 | Prasad | .............. | H01L 29/40111 |
| 2023/0282283 A1* | 9/2023 | Harari | ................. | H01L 29/6684 |
| | | | | 257/295 |

* cited by examiner

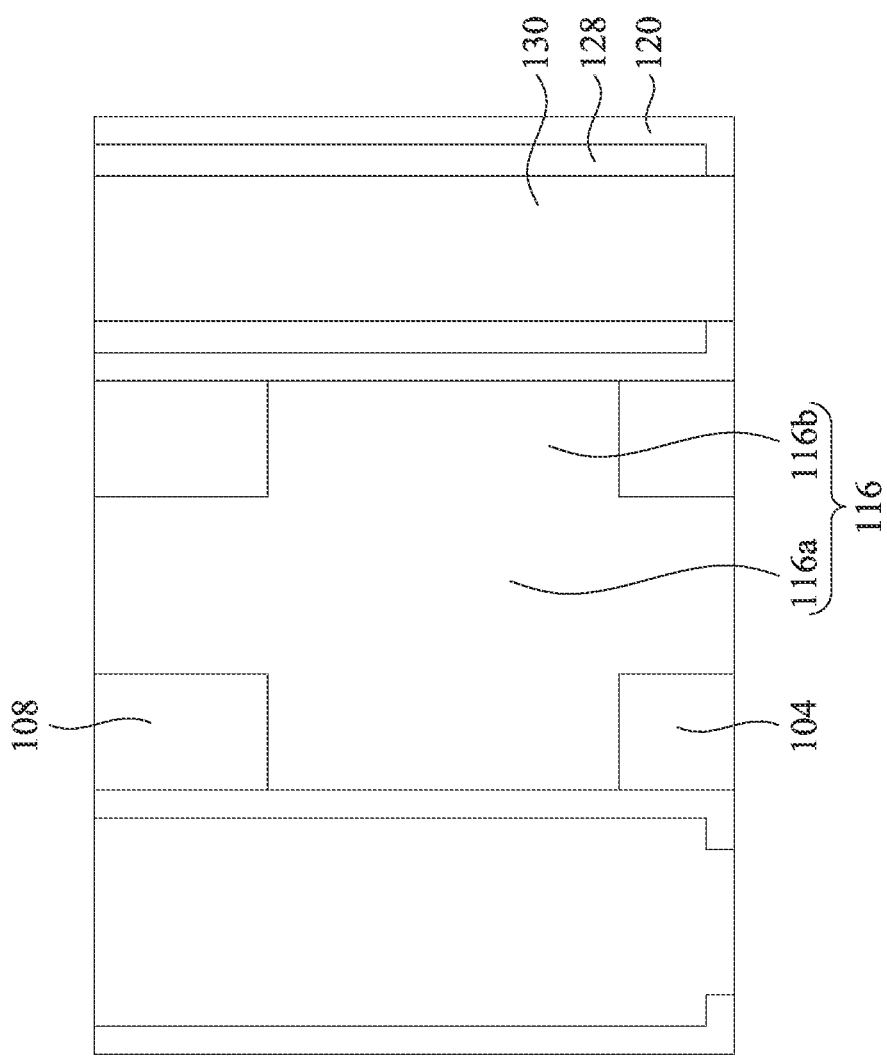

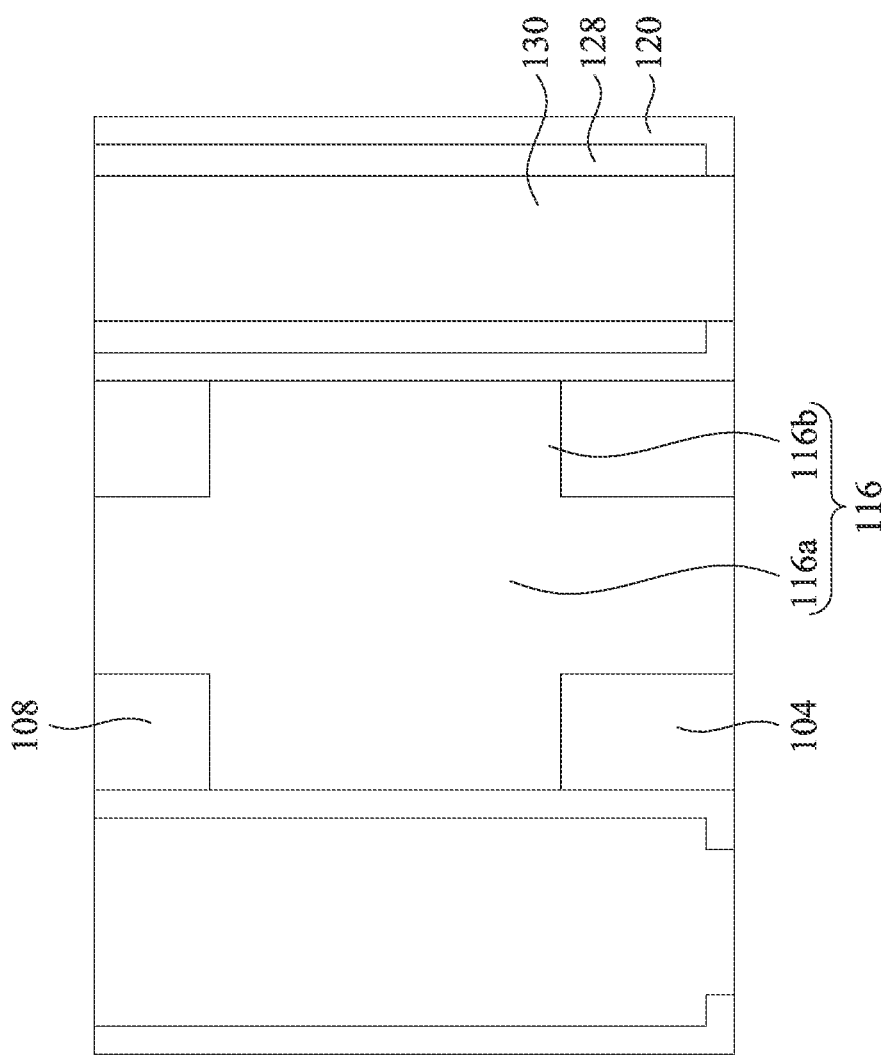

MEMORY DEVICE AND FORMING METHOD THEREOF

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13-18 illustrate cross-sectional views of a FRAM memory cell in accordance with various embodiments of the present disclosure.

DETAILED DESCRIPTION

Figure 1A:
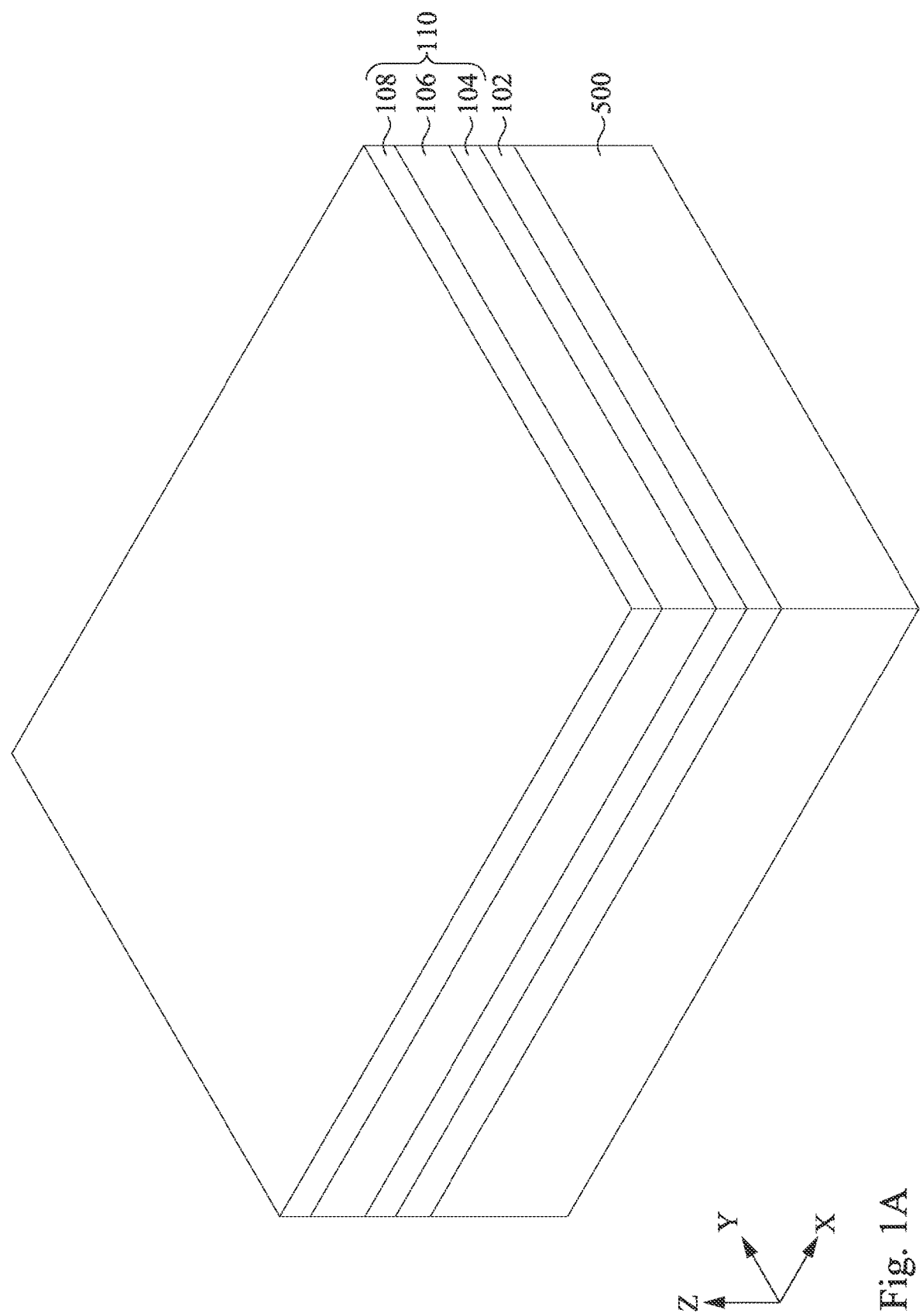
FIGS. 1A-12D are perspective views and cross-sectional views illustrating intermediate stages in formation of an example integrated circuit (IC) structure having FRAM memory cells, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory devices include a grid of independently functioning memory cells formed on a substrate. Memory devices may include volatile memory or nonvolatile (NV) memory cells. In contrast to volatile memory cells that require constant power to retain their memory values, non-volatile memory cells are capable of retaining information when power is not applied thereto. For example, computers including nonvolatile memory cells do not need to be booted up when switched on. Emerging nonvolatile memory technologies may include, by way of example and not limitation, resistive random-access memory (RRAM), magneto-resistive random-access memory (MRAM), ferroelectric (FE) random-access memory (FRAM or FeRAM), and phase-change memory (PCM).

FRAM is a random-access memory that utilizes memory cells that include a FE material to store information as FE polarization. An FE material has an equilibrium-state bulk electric dipole moment. This occurs in solid ceramics when ground state crystal structure involves spatial separation of ionic charges, and the unit cell lacks a center of symmetry. Nanoscale alignment of the microscopic electric dipole moments is responsible for bulk ferroelectric behavior. The magnitude of the dipole polarization and its orientation may be controlled by application of modest electric fields. The change in orientation may be a promising indication of the stored value. FRAM is commonly organized in single-transistor, single-capacitor (1T/1C) or two-transistor, two-capacitor (2T/2C) configurations, in which each memory cell includes one or more access transistors. The non-volatility of an FRAM is due to the bi-stable characteristic of the FE material in the cell capacitor(s).

FRAM memory cells may include a FE tunnel junction (FTJ). Generally, a FTJ may include a metal-FE-metal (MFM) structure, including an FE layer disposed between two metal layers (e.g., electrodes). In FRAM cell fabrication, a word line is formed in a back-end-of-the-line (BEOL) interconnect structure to serve as a gate electrode for an access transistor of FRAM memory cell. A gate dielectric layer and a channel layer are then deposited as horizontal layers over the BEOL interconnect structure. A source line is then formed on a source region of the channel layer, and an MFM structure is formed over a drain region of the channel layer. If a larger cell current is required, it may count on increasing in the channel length in a horizontal direction, which in turn results in an enlarged footprint for each FRAM memory cell, thereby frustrating scaling down of IC. Therefore, various embodiments of the present disclosure generally relate to a FRAM memory device that includes a vertical channel layer, instead of a horizontal channel layer. In this way, the channel length of FRAM access transistor can be increased by increasing gate height (i.e., word line thickness) without increasing in memory cell footprint. As a result, the cell current can be improved without impact on memory cell footprint.

FIGS. 1A-12D are perspective views and cross-sectional views illustrating intermediate stages in formation of an example integrated circuit (IC) structure having FRAM memory cells, in accordance with some embodiments of the present disclosure. Although the perspective views and cross-sectional views shown in FIGS. 1A-12D are described with reference to a method, it will be appreciated that the structures shown in FIGS. 1A-12D are not limited to the method but rather may stand alone separate of the method. Although FIGS. 1A-12D are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 1B:
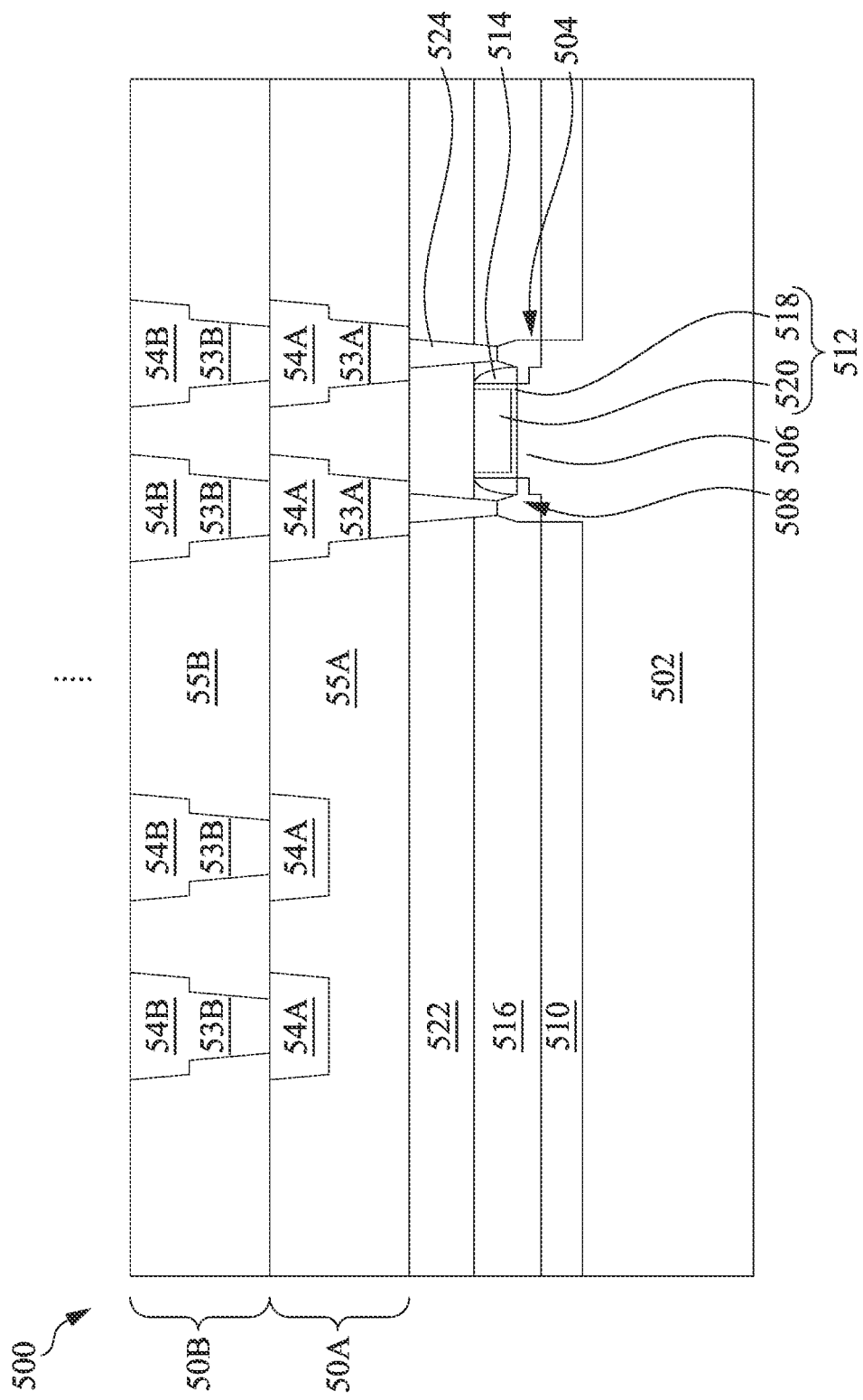

FIG. 1A is a perspective view of an example initial structure comprising a logic circuit structure 500. FIG. 1B illustrates a cross-sectional view of an example logic circuit structure 500 comprising a semiconductor substrate 502 in which various electronic devices may be formed, and a portion of a multilevel interconnect structure (e.g., layers 50A and 50B) formed over the substrate 502, in accordance with some embodiments. Generally, FIG. 1B illustrates a transistor 504 formed on the substrate 502, with multiple interconnection layers formed thereover. As indicated by the ellipsis at the top of FIG. 1B, multiple interconnect levels (e.g., a plurality of layers 50B stacked one above another) may be similarly stacked in the fabrication process of an integrated circuit. In the illustrated embodiments, the transistor 504 is a FinFET. In some other embodiments, the transistor 504 is a planar FET, a nanosheet FET, a nanowire FET, or other suitable FET. Transistors 504 and the overlying interconnect wires in the multilevel interconnect structure can be electrically coupled to function as logic circuits.

The substrate 502 illustrated in FIG. 1B may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, MN, and the like), or their alloys (e.g., $Ga_xAl_{1-x}As$, $Ga_xAl_{1-x}N$, $In_xGa_{1-x}As$ and the like), or combinations thereof. The semiconductor materials may be doped or undoped. Other substrates that may be used include multi-layered substrates, gradient substrates, or hybrid orientation substrates.

In some embodiments, the FinFET device 504 illustrated in FIG. 1B is a three-dimensional MOSFET structure formed in fin-like strips of semiconductor protrusions 506 referred to as fins. The cross-section shown in FIG. 1B is taken along a longitudinal axis of the fin in a direction parallel to the direction of the current flow between the source and drain regions 508. The fin 506 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 506 by etching a trench into the substrate 502 using, for example, reactive ion etching (RIE). FIG. 1B illustrates a single fin 506, although the substrate 502 may comprise any number of fins.

Shallow trench isolation (STI) regions 510 formed along opposing sidewalls of the fin 506 are illustrated in FIG. 1B. STI regions 510 may be formed by depositing one or more dielectric materials (e.g., silicon oxide) to completely fill the trenches around the fins and then recessing the top surface of the dielectric materials. The dielectric materials of the STI regions 510 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 510 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 510 such that an upper portion of fin 506 protrudes from surrounding insulating STI regions 510. In some cases, the patterned hard mask used to form the fin 506 may also be removed by the planarization process.

In some embodiments, the gate structure 512 of the FinFET device 504 illustrated in FIG. 1B is a high-k, metal gate (HKMG) gate structure that may be formed using a gate-last process flow. In a gate last process flow a sacrificial dummy gate structure (not shown) is formed after forming the STI regions 510. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 510. As described in greater detail below, the dummy gate structure may be replaced by the HKMG gate structure 512 as illustrated in FIG. 1B. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions (collectively referred to as "source/drain regions" or "S/D regions") 508 and spacers 514 of FinFET 504, illustrated in FIG. 1B, are formed, for example, self-aligned to the dummy gate structures. Spacers 514 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 514 along the sidewalls of the dummy gate structures.

Source and drain regions 508 are semiconductor regions in direct contact with the semiconductor fin 506. In some embodiments, the source and drain regions 508 may comprise heavily-doped regions and relatively lightly-doped drain extensions, or LDD regions. Generally, the heavily-doped regions are spaced away from the dummy gate structures using the spacers 514, whereas the LDD regions may be formed prior to forming spacers 514 and, hence, extend under the spacers 514 and, in some embodiments, extend further into a portion of the semiconductor fin 506 below the dummy gate structure. The LDD regions may be formed, for example, by implanting dopants (e.g., As, P, B, In, or the like) using an ion implantation process.

In some embodiments, the source and drain regions 508 may comprise an epitaxially grown region. For example, after forming the LDD regions, the spacers 514 may be formed and, subsequently, the heavily-doped source and drain regions may be formed self-aligned to the spacers 514 by first etching the fins 506 to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1B. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{15}$ cm$^{-2}$ to $10^{18}$ cm$^{-2}$) of dopants may be introduced into the heavily-doped source and drain regions 508 either in situ during SEG, or by an ion implantation process performed after the SEG, or by a combination thereof.

A first interlayer dielectric (ILD) 516 is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD 516. The HKMG gate structures 512, illustrated in FIG. 1B, may then be formed by first removing the dummy gate structures using one or more etching techniques, thereby creating trenches between respective spacers 514. Next, a replacement gate dielectric layer 518 comprising one more dielectrics, followed by a replacement conductive gate layer 520 comprising one or more conductive materials, are deposited to completely fill the recesses. Excess portions of the gate structure layers 518 and 520 may be removed from over the top surface of first ILD 516 using, for example a CMP process. The resulting structure, as illustrated in FIG. 1B, may be a substantially coplanar surface comprising an exposed top surface of first ILD 516, spacers 514, and remaining portions of the HKMG gate layers 518 and 520 inlaid between respective spacers 514.

The gate dielectric layer 518 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 520 may be a multilayered metal gate stack comprising a barrier layer, a work function layer, and a gate-fill layer formed successively on top of gate dielectric layer 518. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, physical vapor deposition (PVD), ALD, PEALD, electrochemical plating (ECP), electroless plating and/or the like.

A second ILD layer 522 may be deposited over the first ILD layer 516, as illustrated in FIG. 1B. In some embodiments, the insulating materials to form the first ILD layer 516 and the second ILD layer 522 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 516 and the second ILD layer 522 may be deposited using any suitable method, such as CVD, physical vapor deposition (PVD), ALD, PEALD, PECVD, SACVD, FCVD, spin-on, and/or the like, or a combination thereof.

As illustrated in FIG. 1B, electrodes of electronic devices formed in the substrate 502 may be electrically connected to conductive features of a first interconnect level 50A using conductive connectors (e.g., contacts 524) formed through the intervening dielectric layers. In the embodiment illustrated in FIG. 1B, the contacts 524 make electrical connections to the source and drain regions 508 of FinFET 504. Contacts 524 to gate electrodes may be formed over STI regions 510, and thus are not shown in the cross-sectional view of FIG. 1B. The contacts may be formed using photolithography techniques. For example, a patterned mask may be formed over the second ILD 522 and used to etch openings that extend through the second ILD 516 to expose a portion of gate structures 512, as well as etch openings that extend further through the first ILD 516 and the CESL (if present) liner below first ILD 516 to expose portions of the source and drain regions 508.

In some embodiments, a conductive liner may be formed in the openings in the first ILD layer 516 and the second ILD layer 522. Subsequently, the openings are filled with a conductive fill material. The liner comprises barrier metals used to reduce out-diffusion of conductive materials from the contacts 524 into the surrounding dielectric materials. In some embodiments, the liner may comprise two barrier metal layers. The first barrier metal comes in contact with the semiconductor material in the source and drain regions 508 and may be subsequently chemically reacted with the heavily-doped semiconductor in the source and drain regions 508 to form a low resistance ohmic contact, after which the unreacted metal may be removed. For example, if the heavily-doped semiconductor in the source and drain regions 508 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the second ILD 522. The resulting conductive plugs extend into the first and second ILD layers 516 and 522 and constitute contacts 524 making physical and electrical connections to the electrodes of electronic devices, such as the tri-gate FinFET 504 illustrated in FIG. 1B.

As illustrated in FIG. 1B, multiple interconnect levels may be formed, stacked vertically above the contact plugs 524 formed in the first and second ILD layers 516 and 522, in accordance with a back end of line (BEOL) scheme adopted for the integrated circuit design. In the BEOL scheme illustrated in FIG. 1B, various interconnect levels have similar features. However, it is understood that other embodiments may utilize alternate integration schemes wherein the various interconnect levels may use different features. For example, the contacts 524, which are shown as vertical connectors, may be extended to form conductive lines which transport current laterally.

In this disclosure, the interconnect level comprises conductive vias and lines embedded in an inter-metal dielectric (IMD) layer. In addition to providing insulation between various conductive elements, an IMD layer may include one or more dielectric etch stop layers to control the etching processes that form openings in the IMD layer. Generally, vias conduct current vertically and are used to electrically connect two conductive features located at vertically adjacent levels, whereas lines conduct current laterally and are used to distribute electrical signals and power within one level. In the BEOL scheme illustrated in FIG. 1B, conductive vias 53A connect contacts 524 to conductive lines 54A and, at subsequent levels, vias connect lower lines to upper lines (e.g., lines 54A and 54B can be connected by via 53B). Other embodiments may adopt a different scheme. For example, vias 53A may be omitted from the second level and the contacts 524 may be configured to be directly connected to lines 54A.

The first interconnect level 50A may be formed using, for example, a dual damascene process flow. First, a dielectric stack used to form IMD layer 55A may be deposited using one or more layers of the dielectric materials listed in the description of the first and second ILD layers 516 and 522. In some embodiments, IMD layer 55A includes an etch stop layer (not shown) positioned at the bottom of the dielectric stack. The etch stop layer comprises one or more insulator layers (e.g., SiN, SiC, SiCN, SiCO, CN, combinations thereof, or the like) having an etch rate different than an etch rate of an overlying material. The techniques used to deposit the dielectric stack for IMD may be the same as those used in forming the first and second ILD layers 516 and 522.

Appropriate photolithography and etching techniques (e.g., anisotropic RIE employing fluorocarbon chemistry) may be used to pattern the IMD layer 55A to form openings for vias and lines. The openings for vias may be vertical holes extending through IMD layer 55A to expose a top conductive surface of contacts 524, and openings for lines may be longitudinal trenches formed in an upper portion of the IMD layer 55A. In some embodiments, the method used to pattern holes and trenches in IMD 55A utilizes a via-first scheme, wherein a first photolithography and etch process form holes for vias, and a second photolithography and etch process form trenches for lines. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of IMD layer 55A and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Several conductive materials may be deposited to fill the holes and trenches forming the conductive features 53A and 54A of the first interconnect level 50A. The openings may be first lined with a conductive diffusion barrier material and then completely filled with a conductive fill material deposited over the conductive diffusion barrier liner. In some embodiments, a thin conductive seed layer may be deposited over the conductive diffusion barrier liner to help initiate an electrochemical plating (ECP) deposition step that completely fills the openings with a conductive fill material.

The diffusion barrier conductive liner in the vias 53A and lines 54A comprises one or more layers of TaN, Ta, TiN, Ti, Co, or the like, or combinations thereof. The conductive fill layer in the vias 53A and lines 54A may comprise metals such as Cu, Al, W, Co, Ru, or the like, or combinations thereof, or multi-layers thereof. The conductive materials used in forming the conductive features 53A and 54A may be deposited by any suitable method, for example, CVD, PECVD, PVD, ALD, PEALD, ECP, electroless plating and the like. In some embodiments, the conductive seed layer may be of the same conductive material as the conductive fill layer and deposited using a suitable deposition technique (e.g., CVD, PECVD, ALD, PEALD, or PVD, or the like).

Any excess conductive material over the IMD 55A outside of the openings may be removed by a planarizing process (e.g., CMP) thereby forming a top surface comprising dielectric regions of IMD 55A that are substantially coplanar with conductive regions of the conductive lines 54A. The planarization step embeds the conductive vias 53A and conductive lines 54A into IMD 55A, as illustrated in FIG. 1B.

The interconnect level positioned vertically above the first interconnect level 50A in FIG. 1B, is the second interconnect level 50B. In some embodiments, the structures of the various interconnect levels (e.g., the first interconnect level 50A and the second interconnect level 50B) may be similar. In the example illustrated in FIG. 1B, the second interconnect level 50B comprises conductive vias 53B and conductive lines 54B embedded in an insulating film IMD 55B having a planar top surface. The materials and processing techniques described above in the context of the first interconnect level 50A may be used to form the second interconnect level 50B and subsequent interconnect levels.

Although an example electronic device (FinFET 504) and example interconnect structures making connections to the electronic device are described, it is understood that one of ordinary skill in the art will appreciate that the above examples are provided for illustrative purposes only to further explain applications of the present embodiments, and are not meant to limit the present embodiments in any manner.

Figure 1C:
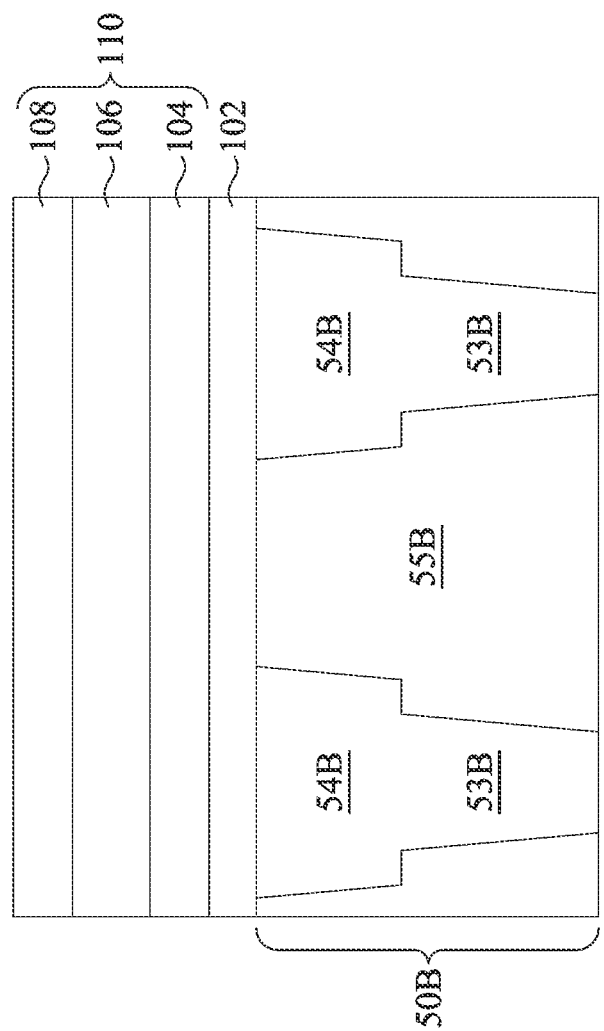

FIG. 1C illustrates a zoomed-in view of a topmost interconnect level 50B at an initial stage of fabrication of FRAM cells, in accordance with some embodiments of the present disclosure. In FIG. 1C, an etch stop layer 102 is formed over the topmost interconnect level 50B, and a multilayer dielectric stack 110 is formed over the etch stop layer 102. The etch stop layer 102 has a higher etch resistance to one or more subsequent etching processes in FRAM cells fabrication than that of each layer in the multilayer dielectric stack 110, and thus the etch stop layer 102 exhibits a slower etch rate than each layer in the multilayer dielectric stack 110. In this way, the etch stop layer 102 can act as a detectable etch end point, and thus the etching process(es) in FRAM cells fabrication can be stopped at the etch stop layer 102.

Figure 3:
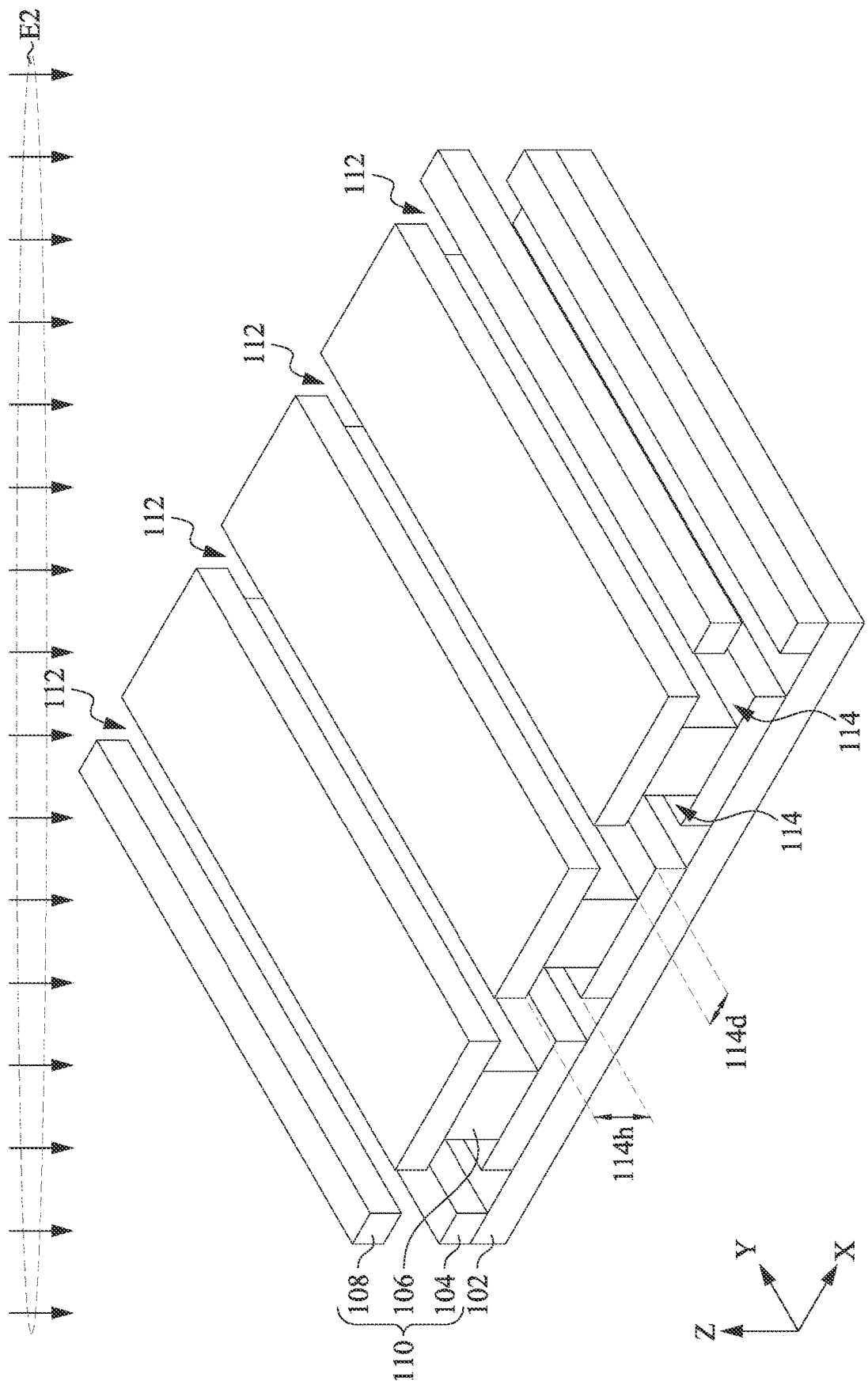

In some embodiments, multilayer dielectric stack 110 is a tri-layer dielectric stack that includes a first dielectric layer (also referred to as bottom layer of tri-layer dielectric stack) 104, a second dielectric layer (also referred to as middle layer of tri-layer dielectric stack) 106 over the first dielectric layer 104, and a third dielectric layer (also referred to as top layer of tri-layer dielectric stack) 108 over the second dielectric layer 106. In some embodiments, the tri-layer dielectric stack 110 is an oxide-nitride-oxide (ONO) stack, and thus the first dielectric layer 104 is an oxide layer (e.g., silicon oxide), the second dielectric layer 106 is a nitride layer (e.g., silicon nitride), and the third dielectric layer 108 is another oxide layer (e.g., silicon oxide). Because the nitride layer 106 is formed of a different material than oxide layers 104 and 108, the nitride layer 106 has a different etch resistance property than the oxide layers 104 and 108, which in turn allows forming recesses between the oxide layers 104 and 108 in subsequent processing (as illustrated in FIG. 3). In some embodiments, the etch stop layer 102 is formed of a different material than each layer of the tri-layer stack 110. For example, the etch stop layer 102 may be SiC, SiCN, SiCO, combinations thereof, or the like.

Gate height of FRAM access transistor depends on the thickness of the second dielectric layer 106. FRAM access transistor channel length and hence the memory cell current depend on the gate height of FRAM access transistor. Therefore, the thickness of the second dielectric layer 106 can be selected to optimize the memory cell current, without impact on memory cell footprint. For example, a thicker dielectric layer 106 can be formed to allow a larger cell current without increasing the memory cell footprint. In some embodiments, the second dielectric layer 106 has a thickness greater than a thickness of the first dielectric layer 104 and a thickness of the third dielectric layer 108. In some embodiments, the first dielectric layer 104 and the third dielectric layer 108 have a same thickness. In some other embodiments, the first and third dielectric layers 104 and 108 have different thicknesses. In some embodiments, the first dielectric layer 104 and the third dielectric layer 108 are formed of a same material (e.g., $SiO_2$). In some other embodiments, the first and third dielectric layers 104 and 108 are formed of different materials.

Figure 2:
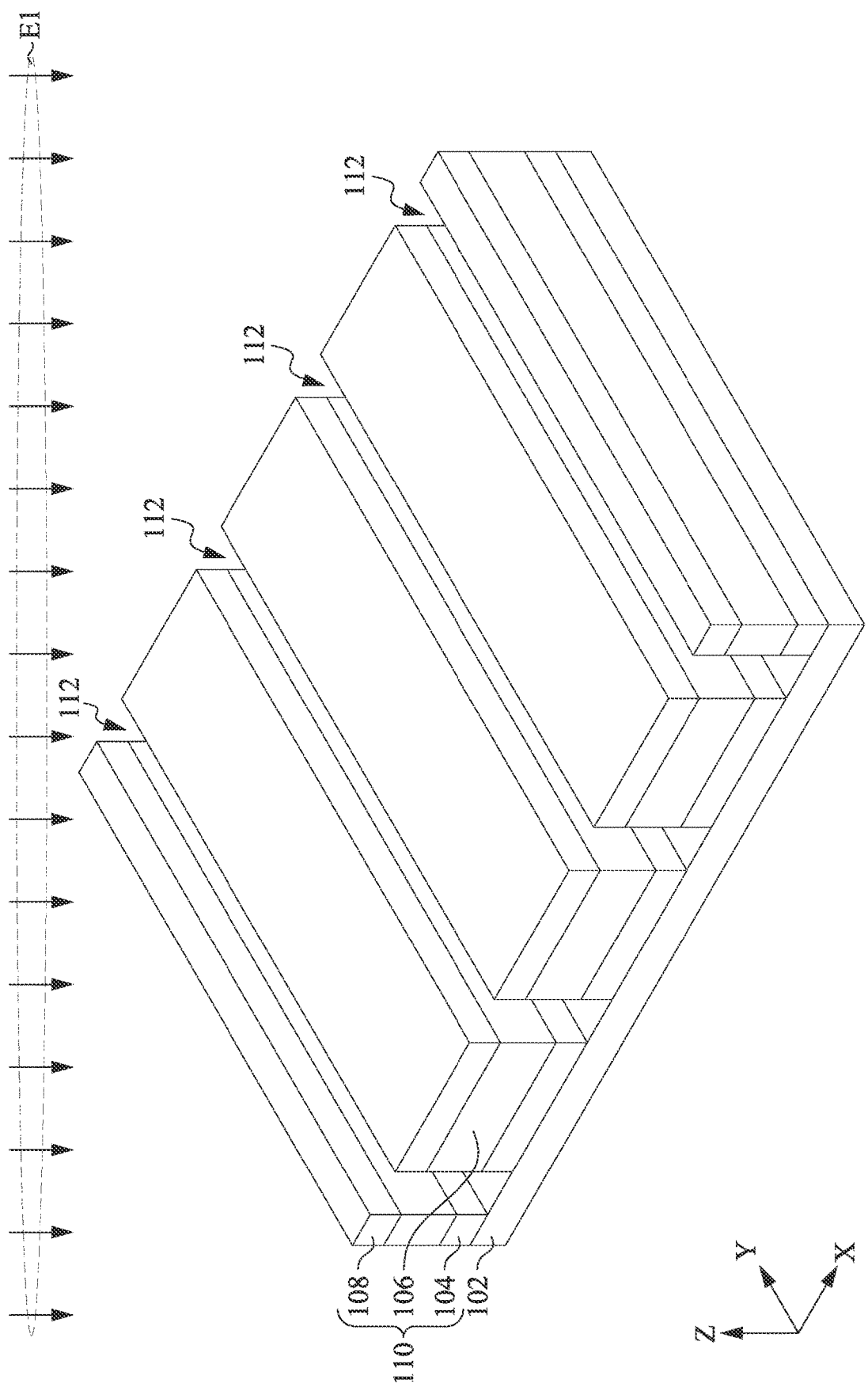

In FIG. 2, the multilayer dielectric stack 110 is patterned to form word line trenches 112 each extending parallel along Y-direction in the multilayer dielectric stack 110. The multilayer dielectric stack 110 is patterned using suitable photolithography and etching techniques. For example, a photoresist layer is formed over the multilayer dielectric stack 110 by using a spin-on coating process, followed by patterning the photoresist layer to expose target regions of the multilayer dielectric stack 110 using suitable photolithography techniques. For example, photoresist layer is irradiated (exposed) and developed to remove portions of the photoresist layer. In greater detail, a photomask or reticle (not shown) may be placed above the photoresist layer, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist layer, and a developer may be used to remove either the exposed or unexposed portions of the photoresist material depending on whether a positive or negative resist is used.

After the patterned photoresist layer is formed, a first etching process E1 (also called word line trench etching process in this context) is performed on the exposed target regions of the multilayer dielectric stack 110, thus forming word line trenches 112 in the multilayer dielectric stack 110. The etch stop layer 102 has a higher etch resistance to the word line trench etching process than that of the multilayer dielectric stack 110. In this way, the etch stop layer 102 can act as a detectable etch end point for the word line trench etching process. The word line trench etching process may include one or more dry etching steps, one or more wet etching steps, or combinations thereof. In some embodiments, the word line trench etching process is anisotropic etching, such as anisotropic dry etching. Although the resultant word line trenches 112 have vertical sidewalls, the one or more etching steps may lead to tapered sidewalls or curved sidewalls in some other embodiments. In FIG. 2 and following figures, the logic circuit structure 500 is not shown for the sake of clarity.

In FIG. 3, after the word line trench etching E1 is completed, sidewalls of the second dielectric layer 106 exposed in the word line trenches 112 are laterally recessed to form sidewall recesses 114 between the first dielectric layer 104 and the third dielectric layer 108 by using a selective etching process E2. Because the second dielectric layer 106 is formed of a different material than the first and third dielectric layers 104 and 108, etching chemicals of the selective etching process E2 can be selected to etch the second dielectric layer 106 at a faster etch rate than etching the first and third dielectric layers 104 and 108. In this way, sidewalls of the second dielectric layer 106 exposed in the word line trenches 112 can be "pulled back," while sidewalls of the first and third dielectric layers 104 and 108 may remain substantially intact. The selective etching process E2 is thus referred to as a middle layer pull back process. As a result, sidewalls of the second dielectric layer 106 are laterally set back from sidewalls of the first and third dielectric layers 104 and 108, thus forming sidewall recesses 114 between the first and third dielectric layers 104 and 108.

In some embodiments, the selective etching process E2 is isotropic etching, such as isotropic wet etching. In some embodiments where the second dielectric layer 106 is silicon nitride, the etching process E2 can use a phosphoric acid ($H_3PO_4$) as an etchant to selectively etch the second dielectric layer 106. As illustrated in FIG. 3, the resultant sidewall recesses 114 each have a recess height 114h extending along Z-direction and a recess depth 114d extending along X-direction. In some embodiments, the recess height 114h is greater than the recess depth 114d, so as to provide sufficient gate height for improving the cell current. In some embodiments, X-direction, Y-direction, and Z-direction are perpendicular to each other.

Figure 4:
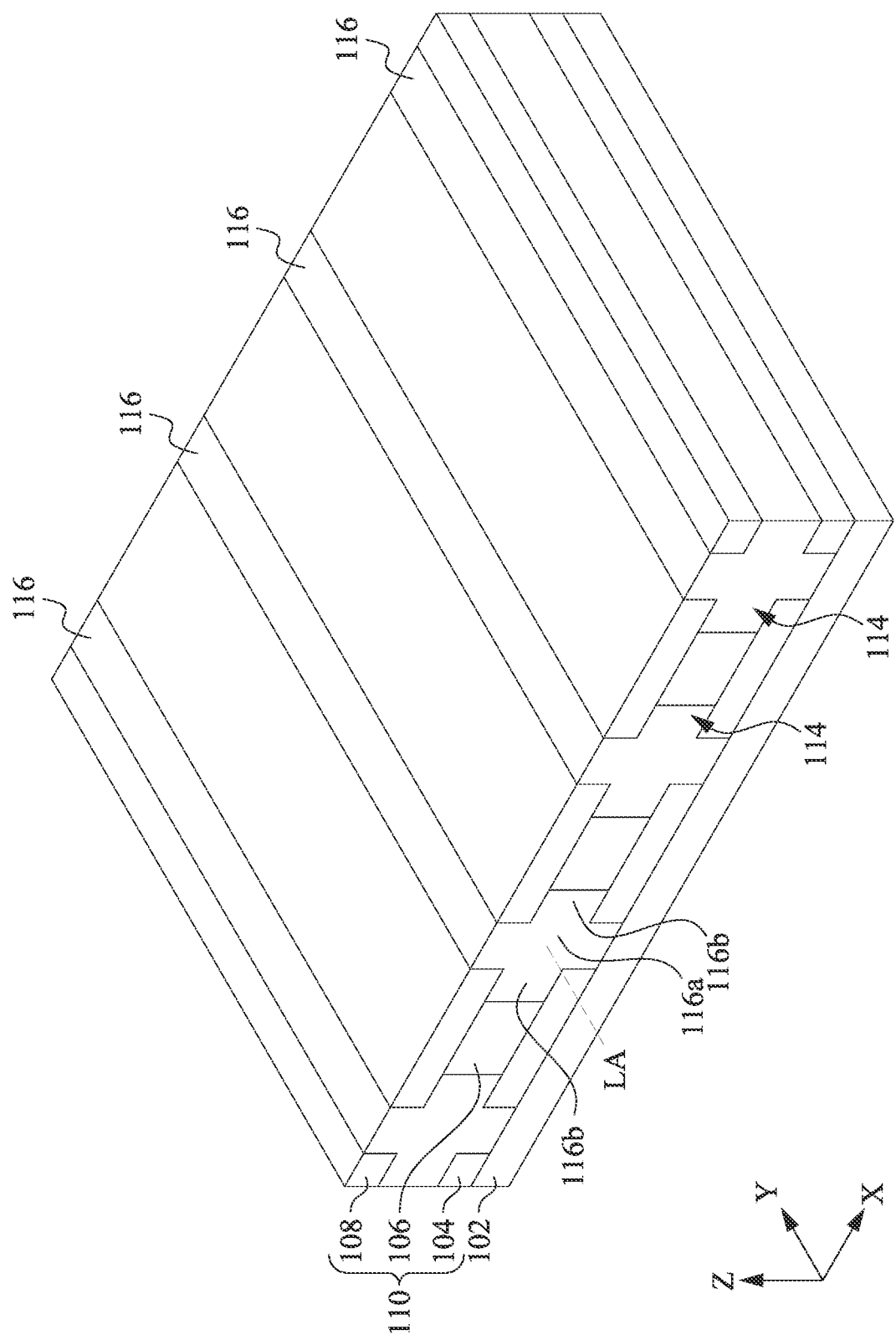

In FIG. 4, word lines 116 are formed in the word line trenches 112 and the sidewall recesses 114. In some embodiments, the word lines 116 can be formed by deposing one or more metal materials into the word line trenches 112 and the sidewall recesses 114 by using suitable deposition techniques (e.g., CVD, PVD, ALD or the like) until the word line trenches 112 and the sidewall recesses 114 are overfilled, followed by performing a CMP process on the one or more metal materials at least until the third dielectric layer 108 gets exposed. The one or more metal materials remaining in the word line trenches 112 and sidewalls recesses 114 can serve as word lines 116 extending along Y-direction and spaced apart along X-direction.

Because the word lines 116 are formed from a same deposition step, they share a same metal composition. For example, the word lines 116 each include Al, Ti, TiN, TaN, Co, Ag, Au, Cu, Ni, Cr, Hf, Ru, W, Pt, WN, Ru, combinations thereof, or the like. In some embodiments, each word line 116 is a single-layer structure, if the word line 116 is formed from a single metal. In some embodiments, each word line 116 is a multilayer structure, if the word line is formed from two or more metal layers. In some embodiments, the word lines 116 have top surfaces substantially coplanar or level with a top surface of the third dielectric layer 108, because of the CMP process.

As illustrated in FIG. 4, each word line 116 includes a central linear portion 116a through which a longitudinal axis LA of the word line 116 extends, and two off-center linear portions 116b laterally offset from the longitudinal axis A of the word line 116. The off-center linear portions 116b extend in the sidewall recesses 114 between the first and third dielectric layers 104 108, and the central linear portion 116a extends outside the sidewall recesses 114 and thus is not sandwiched between the first and third dielectric layers 104 and 108. Therefore, the central linear portion 116a has a greater height than a height of the off-center linear portion 116b, and a height difference between the central linear portion 116a and the off-center linear portion 116b is substantially equal to a total thickness of the first and third dielectric layers 104 and 108. The off-center linear portion 116b can serve as a gate of a subsequently formed FRAM access transistor, which will be described in greater detail below.

Figure 5:
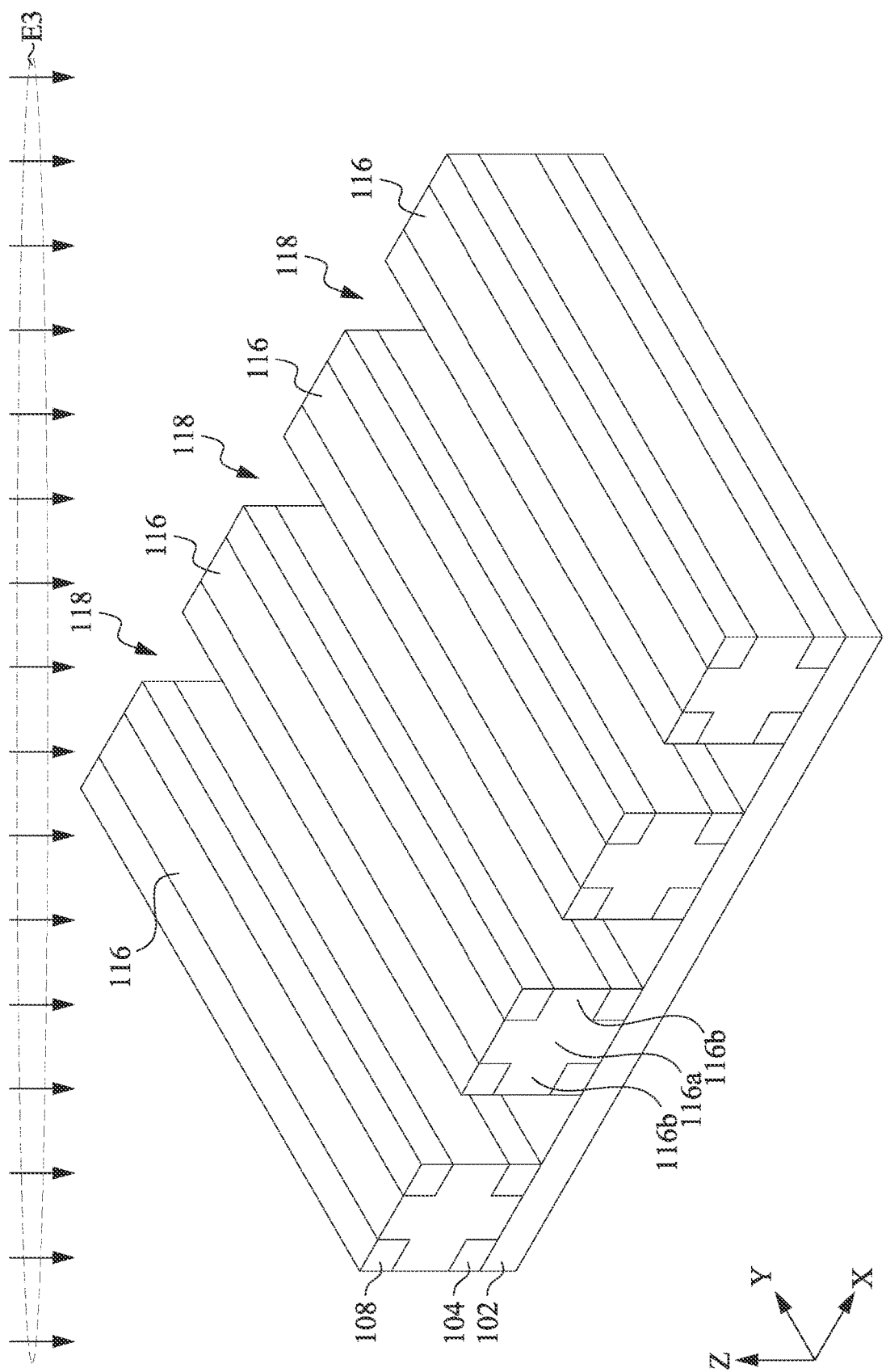

In FIG. 5, multilayer dielectric stack 110 is patterned again, to form channel trenches 118 each extending parallel along Y-direction in the multilayer dielectric stack 110. The channel trenches 118 are alternately arranged with word lines 116 along X-direction. The channel trenches 118 may be formed using suitable photolithography and etching techniques. For example, a photoresist layer is formed over the multilayer dielectric stack 110 and word lines 116 by using a spin-on coating process, followed by patterning the photoresist layer to expose target regions of the multilayer dielectric stack 110, while still covering the word lines 116. For example, photoresist layer is irradiated (exposed) and developed to remove portions of the photoresist layer. In greater detail, a photomask or reticle (not shown) may be placed above the photoresist layer, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist layer, and a developer may be used to remove either the exposed or unexposed portions of the photoresist material depending on whether a positive or negative resist is used.

After the patterned photoresist layer is formed, a third etching process E3 (also called channel trench etching process in this context) is performed on the exposed target regions of the multilayer dielectric stack 110, thus forming channel trenches 118 in the multilayer dielectric stack 110. In some embodiments, the etch stop layer 102 has a higher etch resistance to the channel trench etching process than that of the multilayer dielectric stack 110. In this way, the etch stop layer 102 can act as a detectable etch end point for the channel trench etching process. As illustrated in FIG. 5, each of the off-center lineal portions 116b of word lines 116 has a Z-directional sidewall exposed in a corresponding channel trench 118. The channel trench etching process may include one or more dry etching steps, one or more wet etching steps, or combinations thereof. In some embodiments, the channel trench etching process is anisotropic etching, such as anisotropic dry etching. Although the resultant channel trenches 118 have vertical sidewalls, the one or more etching steps may lead to tapered sidewalls or curved sidewalls in some other embodiments.

Figure 6:
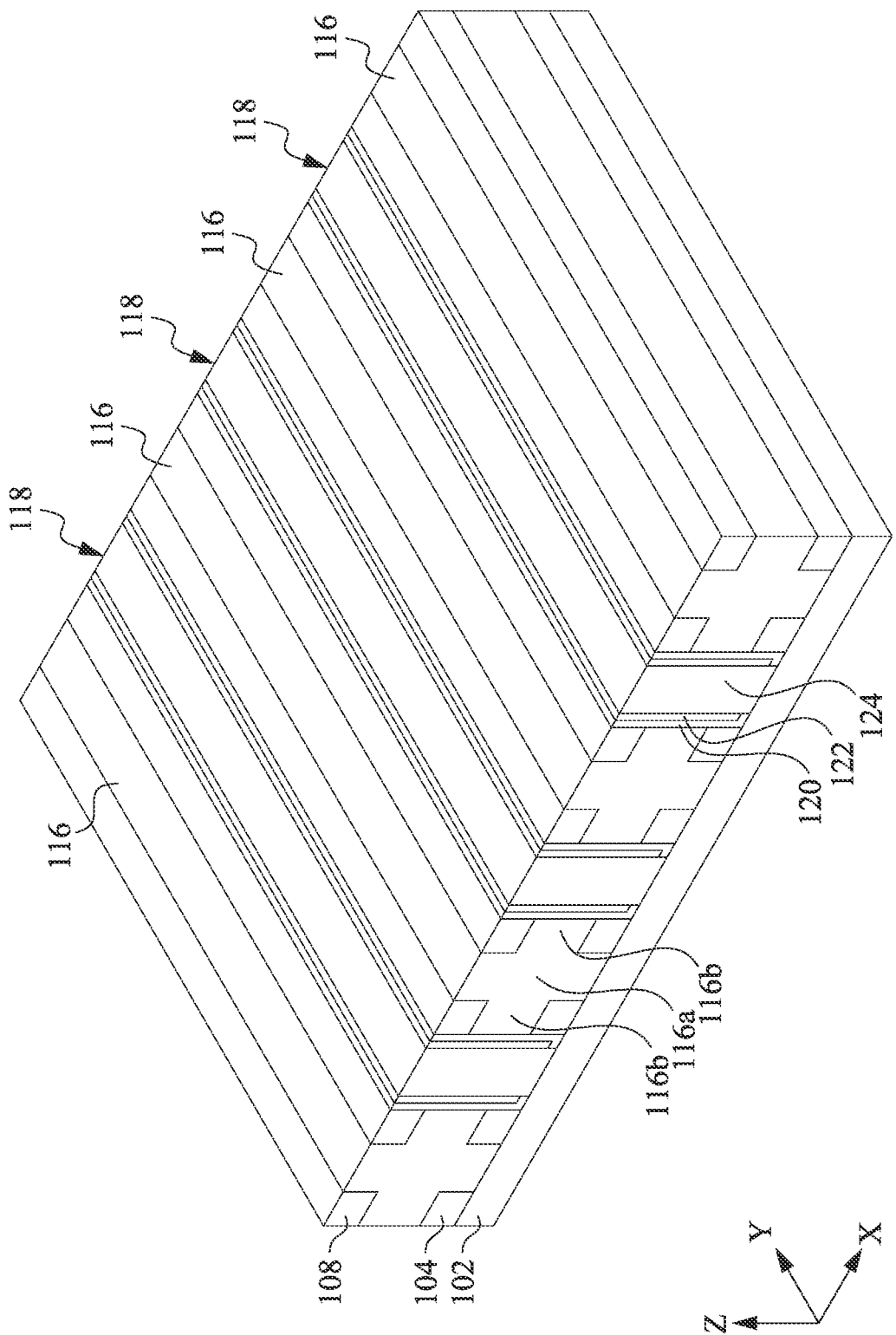

In FIG. 6, a gate dielectric layer 120, a channel layer 122, and a dielectric filling structure 124 are formed in each channel trenches 118. In some embodiments, formation of the gate dielectric layer 120 and the channel layer 122 includes, for example, conformally depositing a blanket layer of gate dielectric in the channel trenches 118 and over top surfaces of the word lines 116 and the third dielectric layer 108, conformally depositing a blanket layer of channel material over the blanket layer of gate dielectric, performing an etching process (e.g., anisotropic etching) to remove horizontal portions of the blanket layer of channel material and horizontal portions of the blanket layer of gate dielectric, while leaving vertical portions of the blanket layer of channel material and horizontal portions of the blanket layer of gate dielectric on sidewalls of the channel trenches 118. The remaining vertical portions of the gate dielectric are denoted as gate dielectric layers 120 in each channel trench 118, and the remaining vertical portions of the channel material are denoted as channel layers 122 in each channel trench 118. Once the gate dielectric layers 120 and the channel layers 122 are formed, a dielectric material is deposited until the channel trenches 118 are overfilled. Afterwards, a CMP process is performed on the dielectric material until top surfaces of the third dielectric layer 108, the word lines 116, the gate dielectric layers 120, and the channel layers 122 are exposed. Remaining portions of the dielectric material in the channel trenches 118 are denoted as dielectric filling structures 124 that fill the respective channel trenches 118.

In some embodiments, the gate dielectric layer 120 includes one or more high-k dielectric layers. High-k gate dielectrics, as used and described herein, include dielectric materials having a high dielectric constant, for example, greater than that of thermal silicon oxide (about 3.9). The high-k dielectric material of the gate dielectric layer 182 may include, by way of example and not limitation, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide ($La_2O_3$), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The channel layer 122 is formed of a semiconductor material to serve as semiconductor channel(s) of FRAM access transistor(s). In some embodiments, the channel layer 122 is formed of metal oxide semiconductor such as InGaZnO (IGZO), indium tin oxide (ITO), IZO, ZnO, IWO, or the like. In some embodiments, the channel layer 122 is formed of a silicon-based material such as polysilicon, amorphous silicon or the like. In some embodiments, the channel layer 122 is doped with a p-type impurity (e.g., boron) or an n-type impurity (e.g., phosphorus or arsenic).

In some embodiments, the dielectric filling structure 124 is formed of silicon oxide. In some other embodiments, the dielectric filling structure 124 may comprise phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), the like, or combinations thereof.

Figure 7:
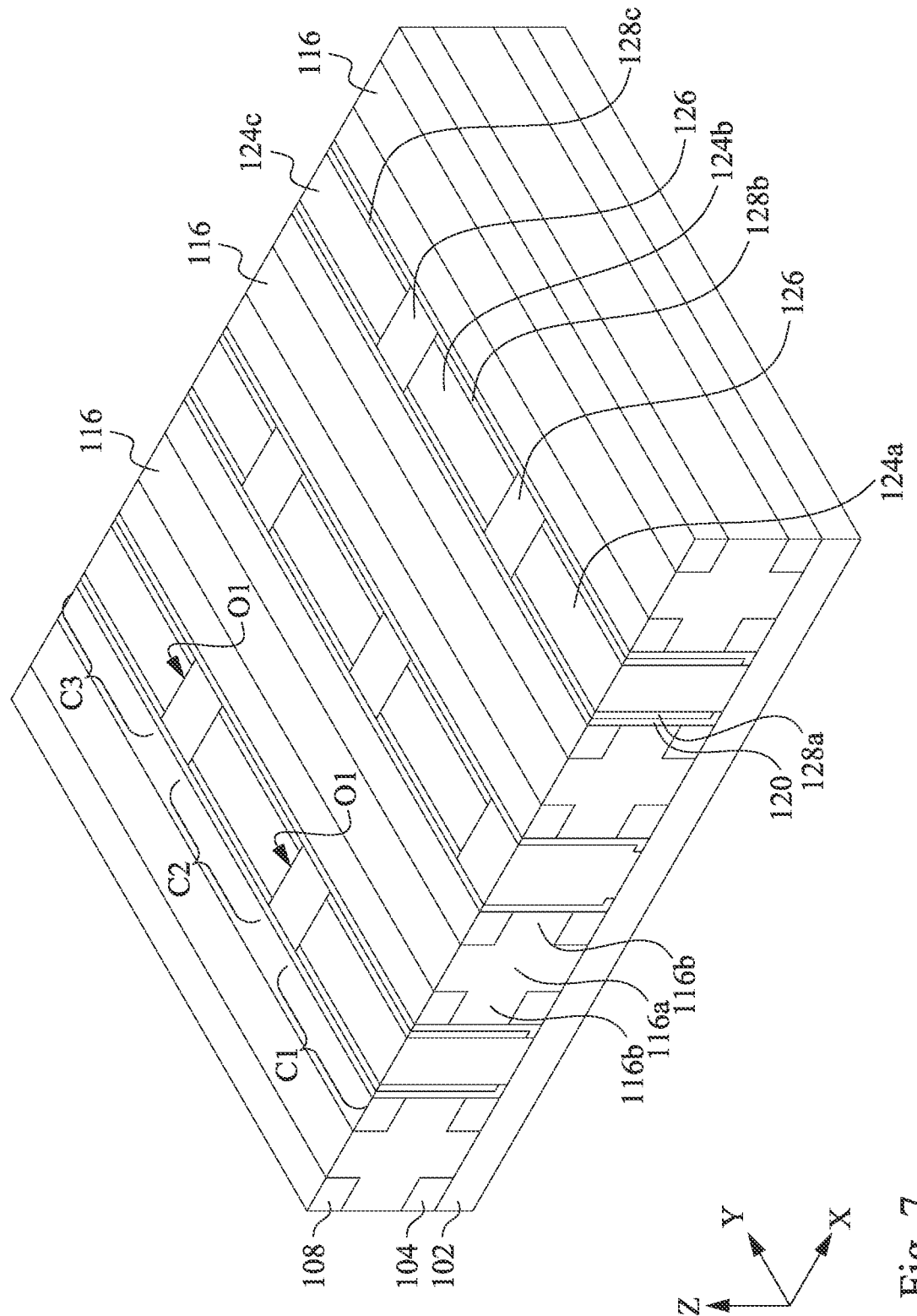

In FIG. 7, memory cell isolation structures 126 are formed to separate each continuous channel layer 122 into individual memory cell channel layers, e.g., channel layers 128a, 128b, and 128c (collectively denoted as memory cell channel layers 128). Formation of the memory cell isolation structures 126 includes, for example, performing photolithography and etching processes to form memory cell isolation openings O1 that separate each continuous dielectric filling structure 124 into discontinuous dielectric filling structures 124a, 124b, and 124c and also separate each continuous channel layer 122 into discontinuous channel layers 128a, 128b, and 128c; depositing one or more dielectric materials (e.g., silicon oxide and/or other suitable dielectric materials) overfilling the memory cell isolation openings O1; and performing a CMP process on the one or more dielectric materials until top surfaces of the third dielectric layer 108, the word lines 116, the gate dielectric layers 120, the channel layers 128a, 128b, 128c, and the dielectric filling structures 124a, 124b, and 124c are exposed. Remaining portions of the one or more dielectric materials in the openings O1 serve as memory cell isolation structures 126 that define individual memory cells (e.g., memory cells C1-C3) arranged in each Y-directional row.

As illustrated in FIG. 7, in the memory cell C1 the dielectric filling structure 124a have opposite sidewalls respectively in contact with two channel layers 128a; in the memory cell C2 the dielectric filling structure 124b have opposite sidewalls respectively in contact with two channel layers 128b; and in the memory cell C3 the dielectric filling structure 124c have opposite sidewalls respectively in contact with two channel layers 128c. The dielectric filling structures 124a, 124b, and 124c are arranged and aligned along Y-direction. The channel layers 128a, 128b, and 128c are also arranged and aligned along Y-direction. The channel layers 128a, 128b, and 128c are electrically isolated by the memory cell isolation structures 126.

Figure 8:
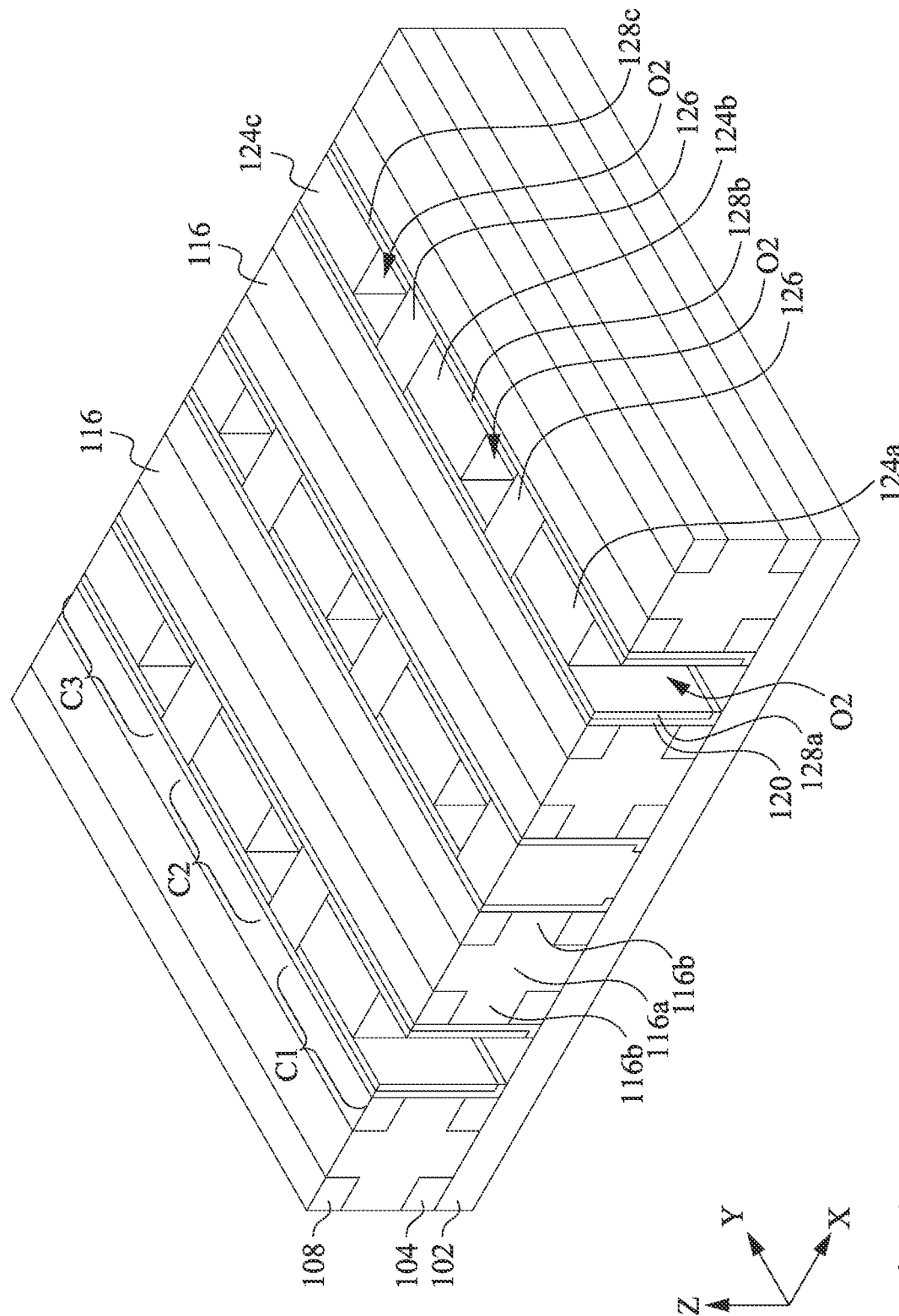
Figure 9:
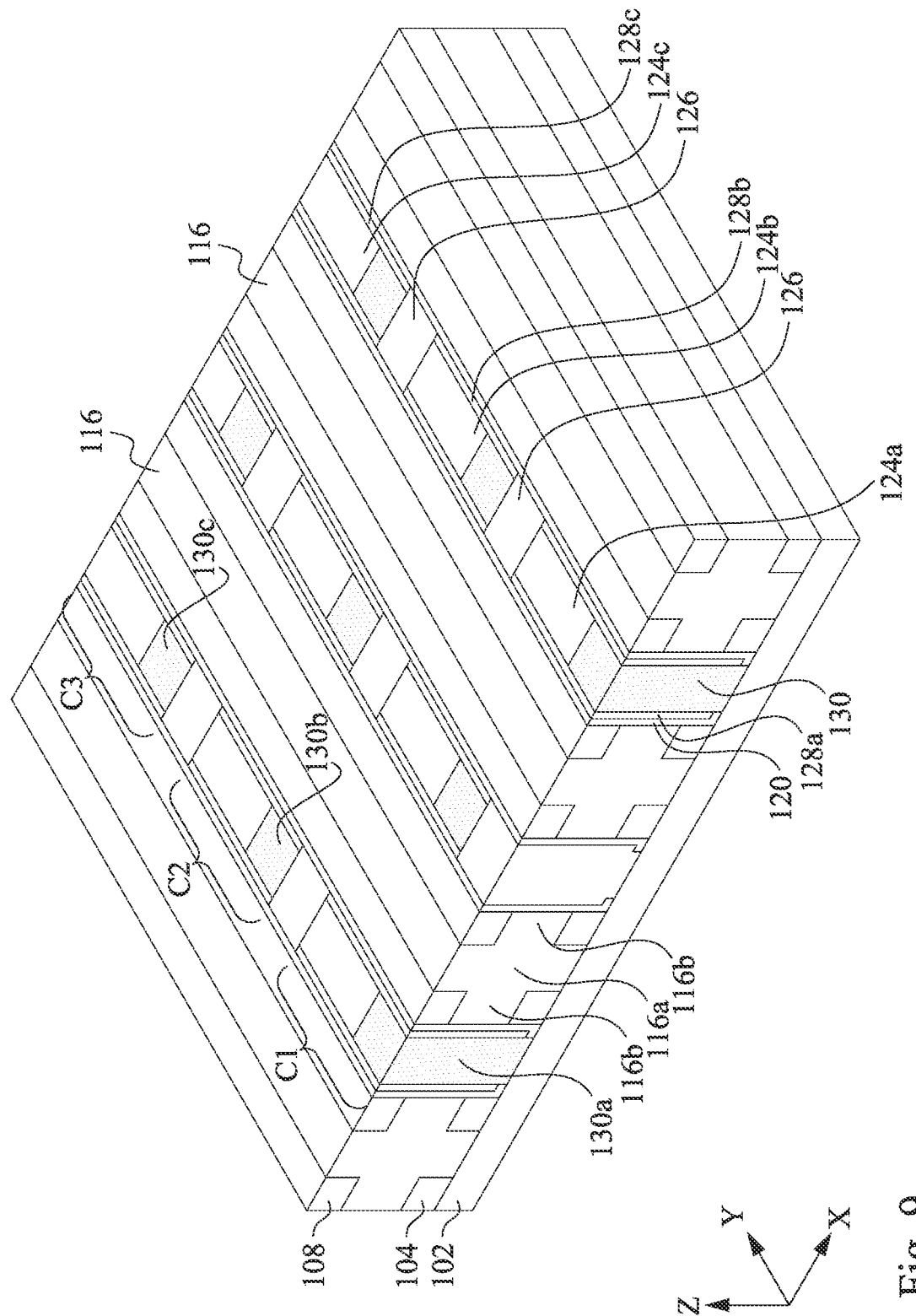

In FIG. 8, photolithography and etching processes are performed to form source line openings O2 in the dielectric filling structures 124a, 124b, and 124c in all memory cells C1-C3. Source regions of the channel layers 128 are exposed in the source line openings O2. Next, in FIG. 9, source lines (also denoted as SL) 130 are formed in the source line openings O2. The source lines 130 include, for example, a source line 130a in the memory cell C1, a source line 130b in the memory cell C2, and a source line 130c in the memory cell C3. Each source line 130 serves as a shared source electrode for access transistors of memory cells in two adjacent Y-directional rows. In greater detail, the source line 130a has opposite sidewalls respectively in contact with source regions of channel layers 128a of memory cells C1 in adjacent Y-directional rows. Therefore, the memory cells C1 in adjacent Y-directional rows share a same source line 130a. The source line 130b has opposite sidewalls respectively in contact with source regions of channel layers 128b of memory cells C2 in adjacent Y-directional rows. Therefore, the memory cells C2 in adjacent Y-directional rows share a same source line 130b. The source line 130c has opposite sidewalls respectively in contact with source regions of channel layers 128c of memory cells C3 in adjacent Y-directional rows. Therefore, the memory cells C3 in adjacent Y-directional rows share a same source line 130c. Because memory cells in adjacent rows share a same source line, memory cell density can be improved.

In some embodiments, the source lines 130 can be formed by deposing one or more metal materials into the source line openings O2 by using suitable deposition techniques (e.g., CVD, PVD, ALD or the like) until the source line openings O2 are overfilled, followed by performing a CMP process on the one or more metal materials at least until other materials get exposed. The one or more metal materials remaining in the source line openings O2 can serve as source lines 130 each extending along Z-direction. Because the source lines 130 are formed from a same deposition step, they share a same metal composition. For example, the source lines 130 each include Al, Ti, TiN, TaN, Co, Ag, Au, Cu, Ni, Cr, Hf, Ru, W, Pt, WN, Ru, combinations thereof, or the like. Metal materials of the source lines 130 and the semiconductor materials of channel layers 128 are selected such that the source lines 130 form ohmic contact with source regions of the channel layers 128 (e.g., metal oxide semiconductor films such as IGZO films, ITO films, IZO films, ZnO films, IWO films, or the like), and thus source regions of the channel layers 128 do not require doped regions, like n-type or p-type doped regions in bulk silicon of CMOS transistors. In some embodiments, each source line 130 is a single-layer pillar, if the source line 130 is formed from a single metal. In some embodiments, each source line 130 is a multilayer pillar, if the source line is formed from two or more metal layers. In some embodiments, the source lines 130 have top surfaces substantially coplanar or level with top surfaces of the word lines 116 and channel layers 128, because of the CMP process.

Figure 10:
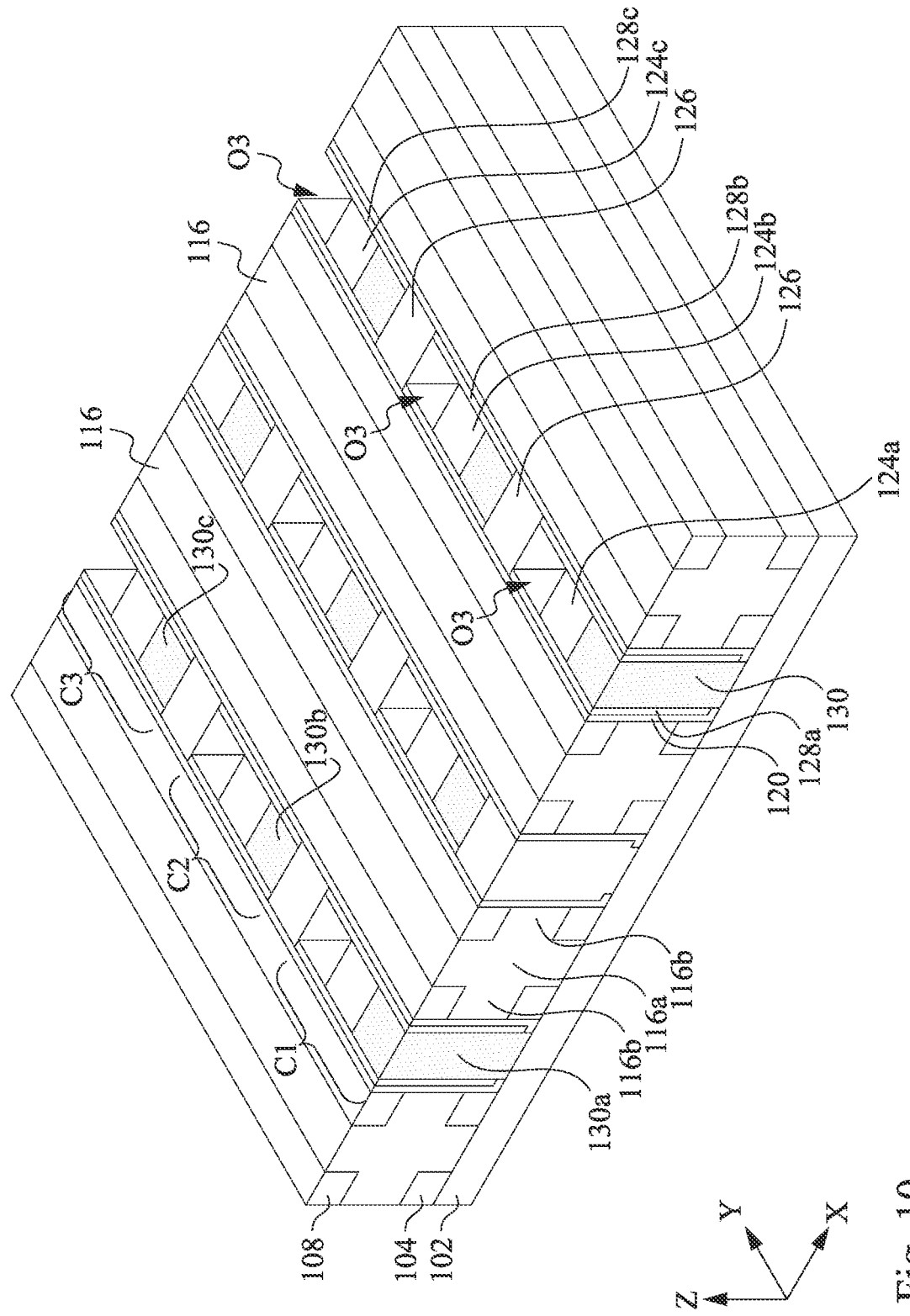

In FIG. 10, photolithography and etching processes are performed to form bit line openings O3 in the dielectric filling structures 124a, 124b, and 124c in all memory cells C1-C3. The bit line openings O3 are separated from the source lines 130 by the dielectric filling structures 124a, 124b, and 124c. Drain regions of the channel layers 128 are exposed in the bit line openings O3. Next, in FIGS. 11A-11C, FE tunnel junction (FTJ) stacks 138 are formed in bit line openings O3. Each FTJ stack 138 is a metal-FE-metal (MFM) structure that includes an outer electrode 132 lining sidewalls and a bottom surface of a corresponding bit line opening O3, an FE layer 134 enclosed peripherally by the outer electrode 132, and an inner electrode 136 enclosed peripherally by the FE layer 134. The inner electrodes 136 serve as bit lines (also denoted as BL) for memory cells. Formation of the FTJ stacks 138 includes conformally depositing a blanket layer of outer electrode material lining the bit line openings O3 by using suitable deposition techniques, conformally depositing a blanket layer of ferroelectric material over the blanket layer of the outer electrode material by using suitable deposition techniques, depositing an inner electrode material over the blanket layer of ferroelectric material, and then performing a CMP process to remove an excess inner electrode material, an excess ferroelectric material and an excess outer electrode material outside the bit line openings. Remaining portions of the outer electrode material, ferroelectric material, and inner electrode materials collectively serve as FTJ stacks 138 filling the bit line openings O3.

Figure 11A:
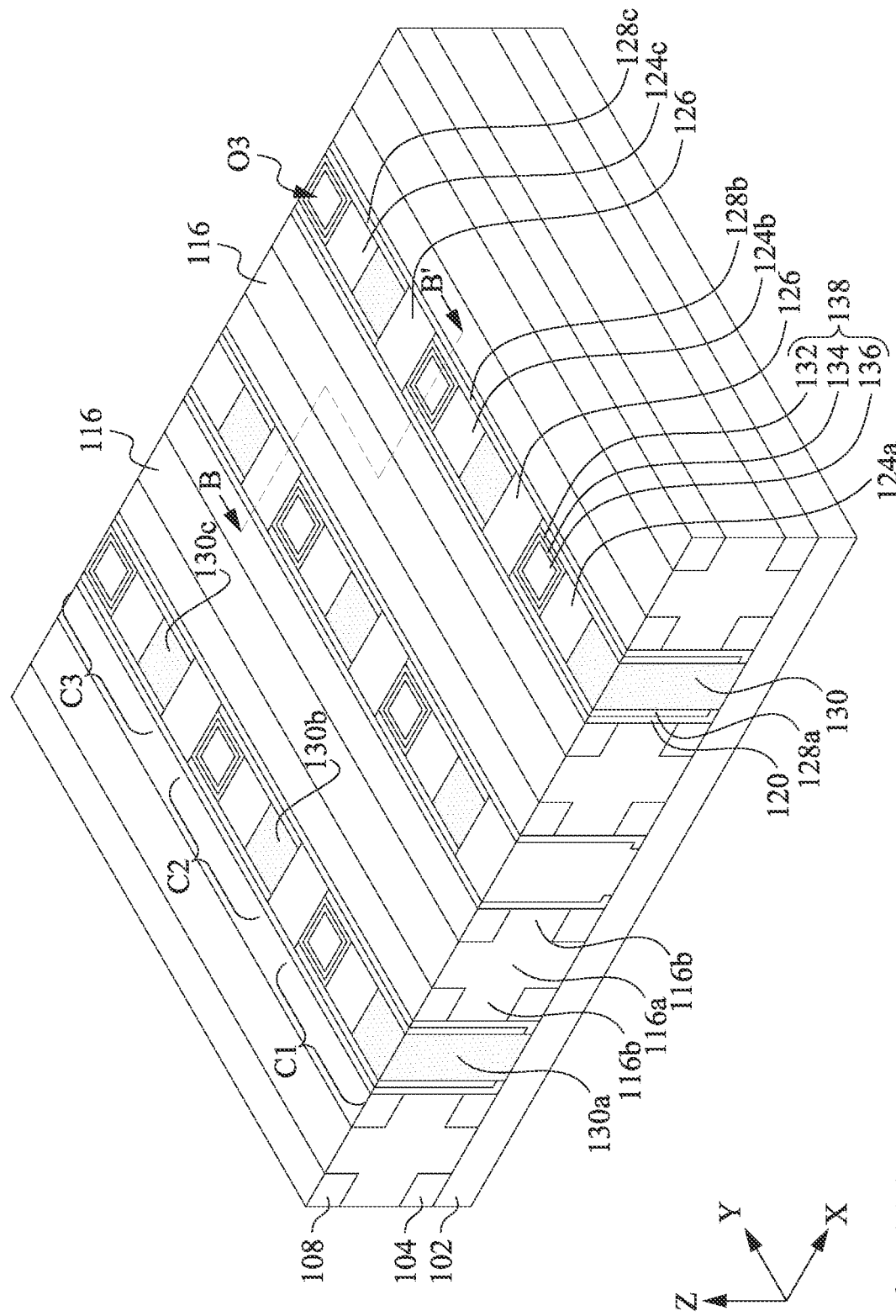
Figure 11B:
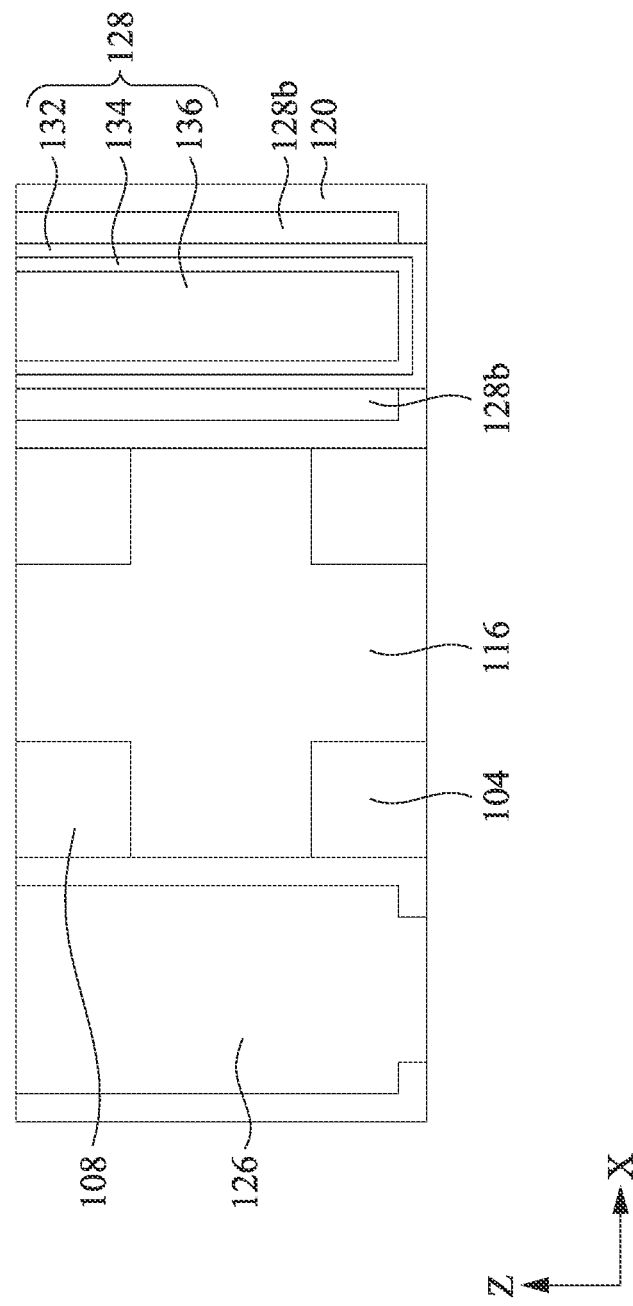

As illustrated in FIG. 11B which is a zoomed-in cross-sectional view taken along line B-B' of FIG. 11A, the resultant outer electrode 132 has a U-shaped cross-section, the FE layer 134 has a U-shaped cross-section over the outer electrode 132, and the inner electrode 136 has a rectangular cross-section over the FE layer 134. In some embodiments, the inner electrode 136 has a larger top surface area than the FE layer 134 and the outer electrode 132, which in turn aids in forming a via localized to the top surface of the inner electrode 136 without touching the FE layer 134 and the outer electrode 132. For example, the top surface area of the inner electrode 136 may be more than three times, four times, five times the top surface area of the FE layer 134 or even more. Similarly, the top surface area of the inner electrode 136 may be more than three times, four times, five times the top surface area of the outer electrode 132 or even more.

Because the outer electrodes 132 of different FTJ stacks 138 are formed from a same deposition step, they share a same metal composition. For example, the outer electrodes 132 of the FTJ stacks 138 each include Al, Ti, TiN, TaN, Co, Ag, Au, Cu, Ni, Cr, Hf, Ru, W, Pt, WN, Ru, combinations thereof, or the like. Metal materials of the outer electrodes 132 and the semiconductor materials of channel layers 128 are selected such that the outer electrodes 132 form ohmic contact with drain regions of the channel layers 128 (e.g., metal oxide semiconductor films such as IGZO films, ITO films, IZO films, ZnO films, IWO films, or the like), and thus drain regions of the channel layers 128 do not require doped regions, like n-type or p-type doped regions in bulk silicon of CMOS transistors.

Because the inner electrodes 136 of different FTJ stacks 138 are formed from a same deposition step, they share a same metal composition. For example, the inner electrodes 136 of the FTJ stacks 138 each include Al, Ti, TiN, TaN, Co, Ag, Au, Cu, Ni, Cr, Hf, Ru, W, Pt, WN, Ru, combinations thereof, or the like. In some embodiments, the FTJ inner electrodes 136 are formed from a metal the same as the source lines 130, but different from the FTJ outer electrodes 132. In some embodiments, the FTJ inner electrodes 136 are formed from a metal different from the source lines, and also different from the FTJ outer electrodes 132. In some embodiments, the FTJ inner electrodes 136, the FTJ outer electrodes 132 and the source lines 130 are formed of a same metal.

Polarization direction (also referred to as polarization orientation) of the FE layer 134 can be switched by an electric field applied by the FTJ electrodes 132 and 136. The electrical resistance of the FTJ stack 138, also referred to as the tunneling electroresistance (TER) of the FTJ stack 138, depends on the polarization orientation of the FE layer 134. Therefore, by changing the electrostatic potential (e.g., voltage) profile across the FE layer 134, the FTJ stack 138 can change from a high-resistance state to a low-resistance state, or vice versa. The FTJ stack 138 is thus referred to as a resistance-switchable element. Because of this binary nature, FTJ stacks 138 can be used to store digital data, with the low-resistance state corresponding to a first data state (e.g., logical "0"), and the high-resistance state corresponding to a second data state (e.g., logical "1").

In some embodiments, the FE layer 134 is formed of $Hf_{1-x}Zr_xO_2$, $HfO_2$, $ZrO_2$, HfTiO, $TiO_2$, NiO, $TaO_x$, $Cu_2O$, $Nb_2O_5$, $AlO_x$, combinations thereof, or the lile. Other suitable ferroelectric materials are within the contemplated scope of disclosure. The FE layer 134 may be formed by depositing an FE material over the outer electrode material using any suitable deposition method, such as PVD, spin coating and annealing, sputtering, CVD, ALD, plasma-enhanced chemical vapor deposition (PECVD), spray pyrolysis, pulsed laser deposition (PLD) or combinations thereof. During the deposition process, the outer electrode 132 (e.g., tungsten or other suitable metals) can serve as a seed metal to promote the growth of a desired crystal phase in the FE layer 134. For example, when the FE layer 134 comprises a Hf-based FE material, the primary crystal phase of the FE layer 134 may have an orthorhombic crystal structure. In particular, the primary crystal phase may account for at least 50 at %, such as from about 55 at % to about 99 at %, or from about 75 at % to about 90 at % of the FE layer 134. In some embodiments, the FE layer 134 may be thermally annealed, to further improve the crystal structure thereof. For example, the FE layer 134 may be annealed using Excimer-laser annealing (ELA), flash lamp annealing (FLA), furnace annealing, or the like.

Figure 11C:
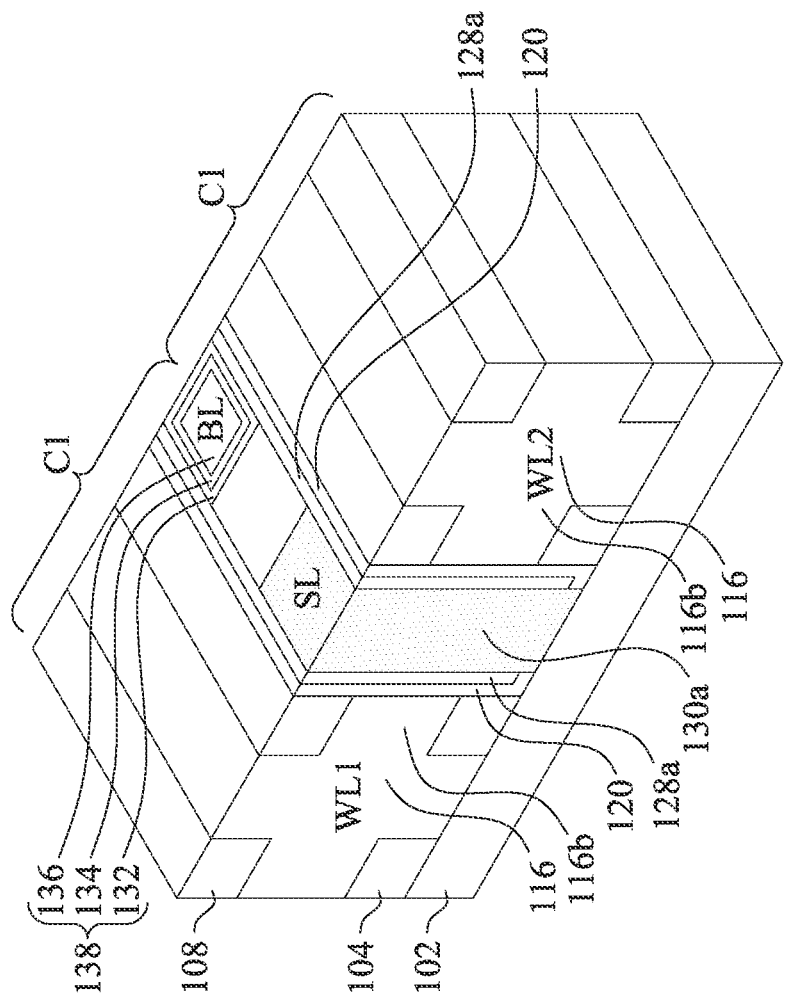

Each FTJ outer electrode 132 can serves as a shared drain electrode for access transistors of memory cells in two adjacent Y-directional rows. For example, as illustrated in FIG. 11C, the FTJ outer electrode 132 has opposite sidewalls respectively in contact with drain regions of channel layers 128a of two memory cells C1 in adjacent Y-directional rows. Therefore, the memory cells C1 in adjacent Y-directional rows share a same outer electrode 132 and hence a same bit line 136. Because memory cells in adjacent rows share a same source line and a same bit line, the memory cell density can be improved.

In FIG. 11C, the word line 116 in the left-side memory cell C1 is denoted as WL1, and the word line 116 in the right-side memory cell C1 is denoted as WL2. The off-center linear portion 116b of the word line WL1 serves as a gate electrode for controlling the current flowing in an adjacent channel layer 128a in the left-side memory cell C1. The off-center linear portion 116b of the word line WL2 serves as a gate electrode for controlling the current flowing in an adjacent channel layer 128a in the right-side memory cell C1. The word line WL1, the source line 130a, and the FTJ outer electrode 132 collectively function as an access transistor serving to access the left-side memory cell C1. The word line WL2, the source line 130a, and the FTJ outer electrode 132 collectively function as an access transistor serving to access the right-side memory cell C1. During an operation (e.g., write operation or read operation) of the left-side memory cell C1, a non-zero word line voltage (VwL) greater than threshold voltage of the access transistor is applied to the word line WL1, the word line WL2 is grounded, a non-zero bit line voltage (VBL) is applied to the bit line 136, and the source line 130a is grounded. During an operation of the right-side memory cell C1, a non-zero word line voltage (VwL) greater than threshold voltage of the access transistor is applied to the word line WL2, the word line WL1 is grounded, a non-zero bit line voltage (VBL) is applied to the bit line 136, and the source line 130a is grounded.

The memory cell current is generally in positive correlation with the channel dimension in Z-direction. The channel dimension in Z-direction depends on height of the gate electrode 116b. Therefore, height of the gate electrode 116b can be controlled to optimize the memory cell current, without impact on memory cell footprint. For example, a taller (or thicker) gate electrode 116b can be formed to allow a larger cell current without increasing footprint of memory cells.

Figure 12A:
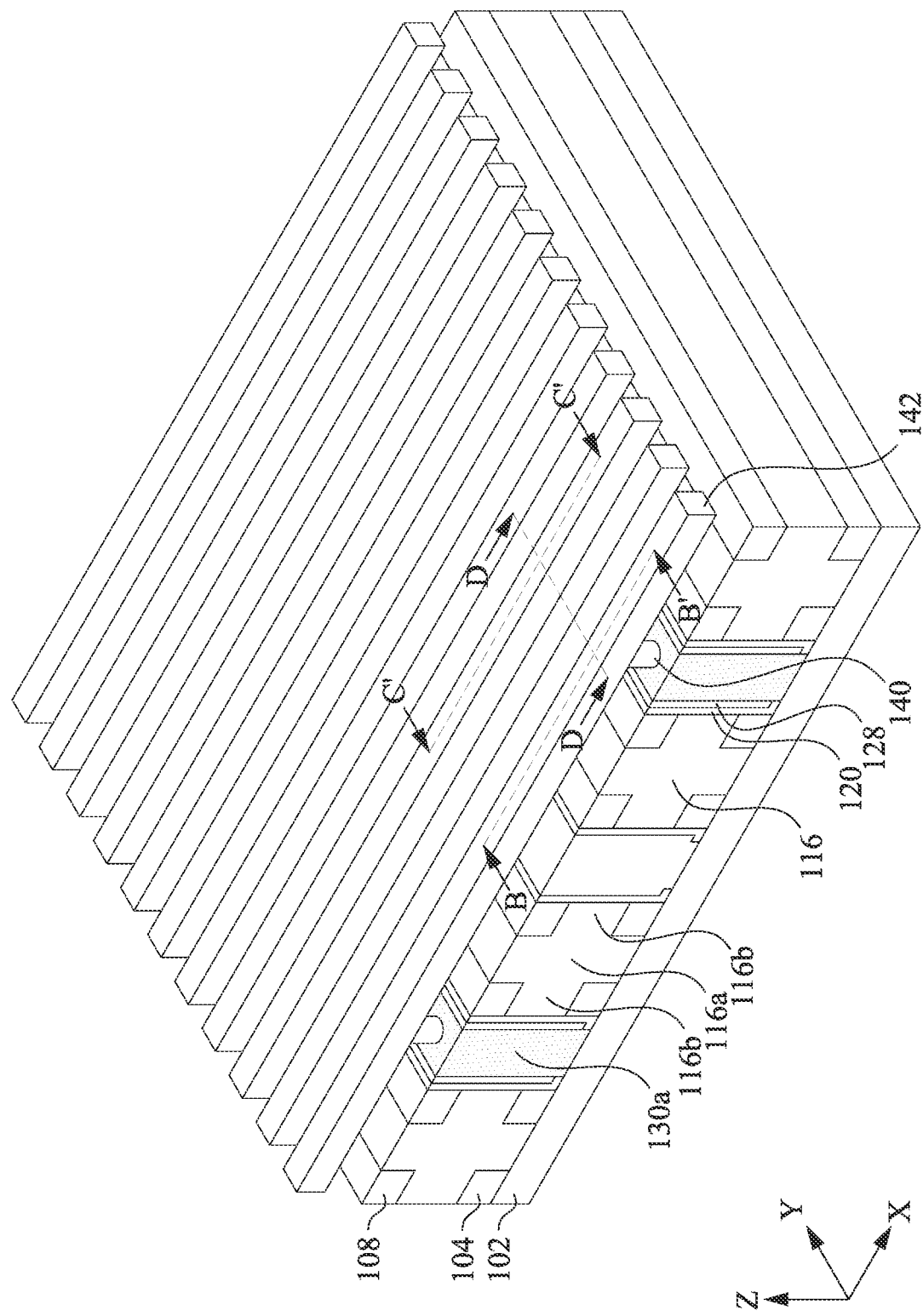
Figure 12B:
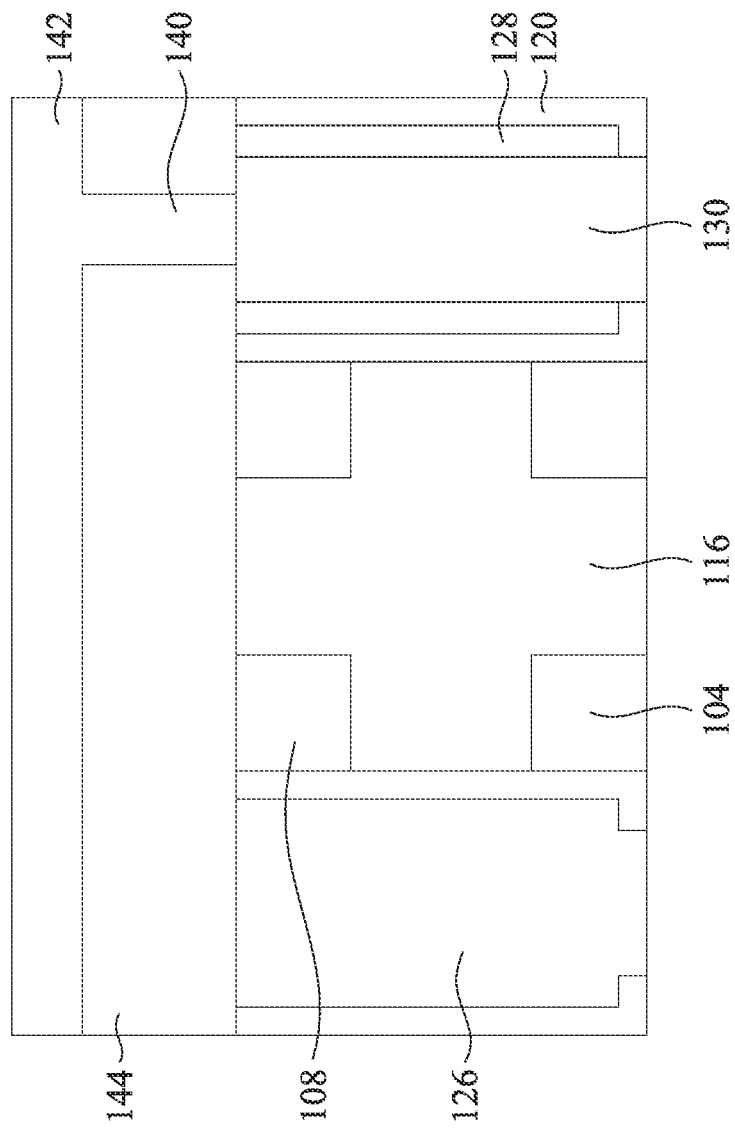
Figure 12C:
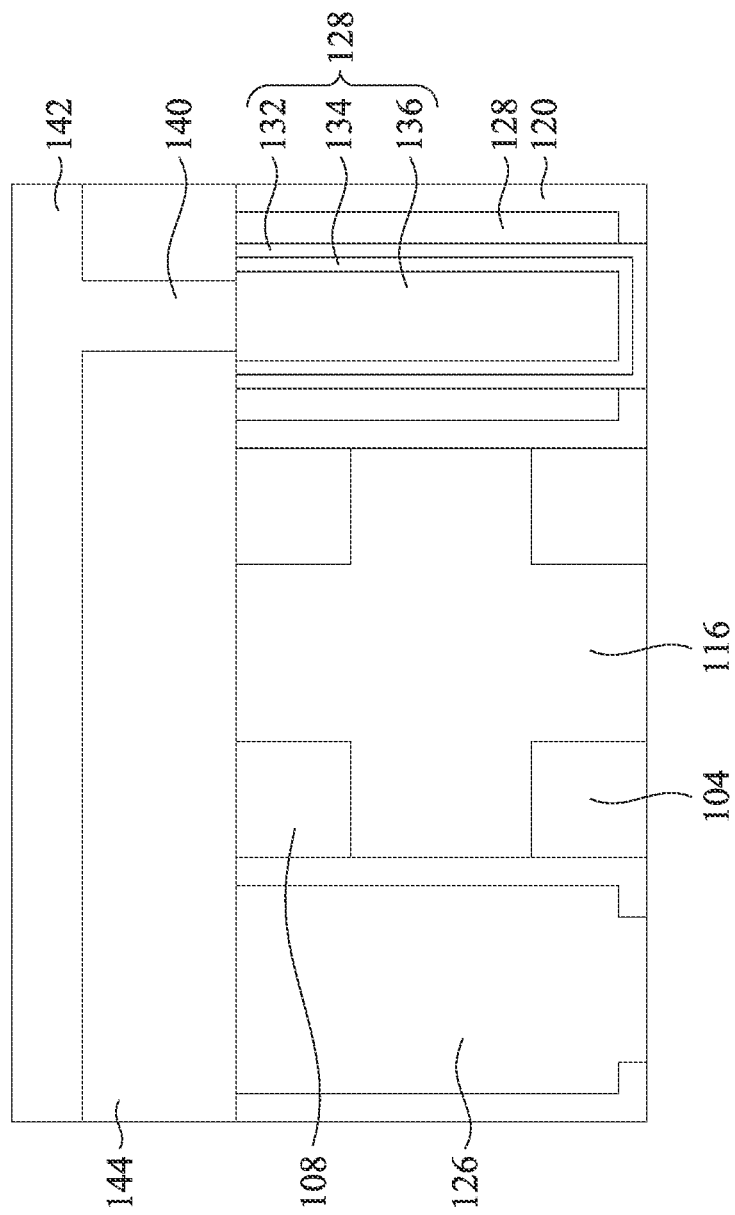
Figure 12D:
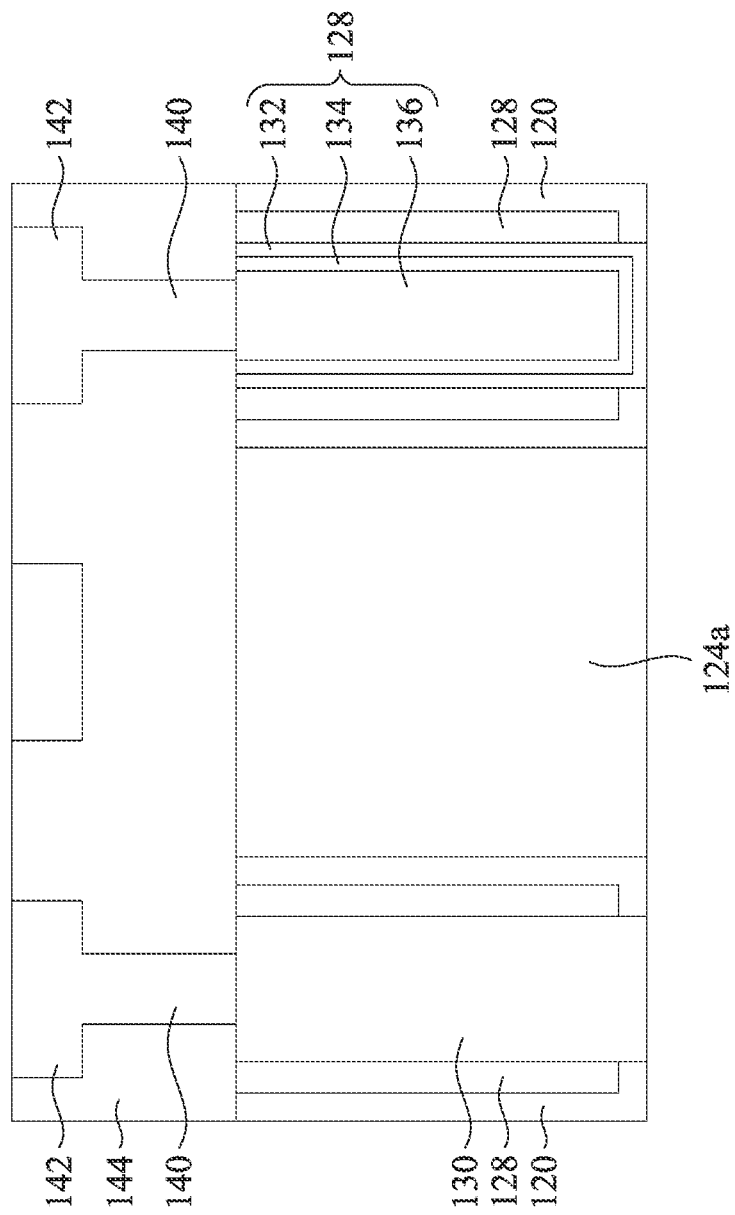

FIG. 12A is a perspective view illustrating metal vias and metal lines formed over the memory cells in accordance with some embodiments of the present disclosure. FIG. 12B is a zoomed-in cross-sectional view taken along line B-B' of FIG. 12A. FIG. 12C is a zoomed-in cross-sectional view taken along line C-C' of FIG. 12A. FIG. 12D is a zoomed-in cross-sectional view taken along line D-D' of FIG. 12A. In FIGS. 12A-12D, metal vias 140 are formed over the source lines 130 and/or the bit lines 136, and metal lines 142 are formed over the metal vias 140. The metal lines 142 electrically coupled to the source lines 130 by the vias 140 function as global source lines. The metal lines 142 electrically coupled to the bit lines 136 by the vias 140 function as global bit lines. In some embodiments, the vias 140 each have a bottom surface area smaller than a top surface area of each source line 130 and a top surface area of each bit line 136.

Formation of the metal vias 140 and metal lines 142 includes, for example, forming an IMD layer 144 over the structure as illustrated in FIGS. 11A-C, performing photolithography and etching processes to form openings for vias 140 and lines 142. The openings for vias 140 may be vertical holes extending through IMD layer 144 to expose top surfaces of source lines 130 and top surfaces of the bit lines 136, and openings for lines 142 may be longitudinal trenches extending in X-direction and formed in an upper portion of the IMD layer 144. In some embodiments, the method used to pattern vertical holes and longitudinal trenches in the IMD layer 144 utilizes a via-first scheme, wherein a first photolithography and etch process form holes for vias 140, and a second photolithography and etch process form trenches for lines 142. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of the IMD layer 144 and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Several metal materials may be deposited to fill the holes and trenches forming the metal vias 140 and metal lines 142. The openings may be first lined with a diffusion barrier metal and then completely filled with a fill metal deposited over the diffusion barrier liner. In some embodiments, a thin metal seed layer may be deposited over the diffusion barrier liner to help initiate an electrochemical plating (ECP) deposition step that completely fills the openings with a fill metal.

The diffusion barrier liner in the vias 140 and lines 142 comprises one or more layers of TaN, Ta, TiN, Ti, Co, or the like, or combinations thereof. The fill metal in the vias 140 and lines 142 may comprise metals such as Cu, Al, W, Co, Ru, or the like, or combinations thereof, or multi-layers thereof. The metal materials used in forming the vias 140 and lines 142 may be deposited by any suitable method, for example, CVD, PECVD, PVD, ALD, PEALD, ECP, electroless plating and the like. In some embodiments, the metal seed layer may be of the same metal material as the fill metal and deposited using a suitable deposition technique (e.g., CVD, PECVD, ALD, PEALD, or PVD, or the like). Any excess conductive material over the IMD layer 144 outside the trenches may be removed by a planarizing process (e.g., CMP) thereby forming a top surface comprising dielectric regions of the IMD layer 144 that are substantially coplanar with conductive regions of the metal lines 142. The planarization step embeds the metal vias 140 and metal lines 142 into the IMD layer 144, as illustrated in FIGS. 12B-12D.

Figure 13:
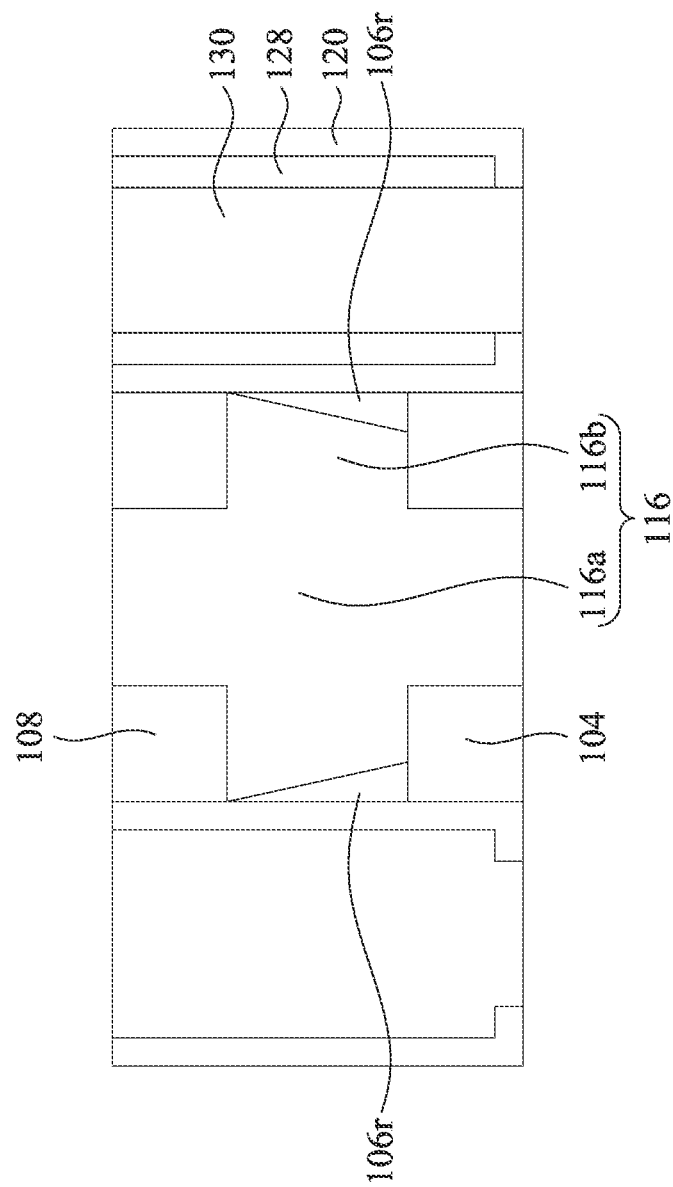

FIGS. 13-16 illustrate cross-sectional views of a FRAM memory cell in accordance with various embodiments of the present disclosure. These embodiments result from various scenarios that could occur in the middle layer pull back process E2 as illustrated in FIG. 3. If the middle layer pull back process E2 etches an upper portion of the middle layer 106 at a faster etch rate than etching a lower portion of the middle layer 106, middle layer residues 106r with a triangular cross-section may remain in memory cells as illustrated in FIG. 13. In greater detail, a middle layer residue (e.g., SiN residues) 106r may interpose the gate electrode 116b and the gate dielectric layer 120 and have a thickness decreasing from a bottom of the residue 106r to a top of the residue 106r.

Figure 14:
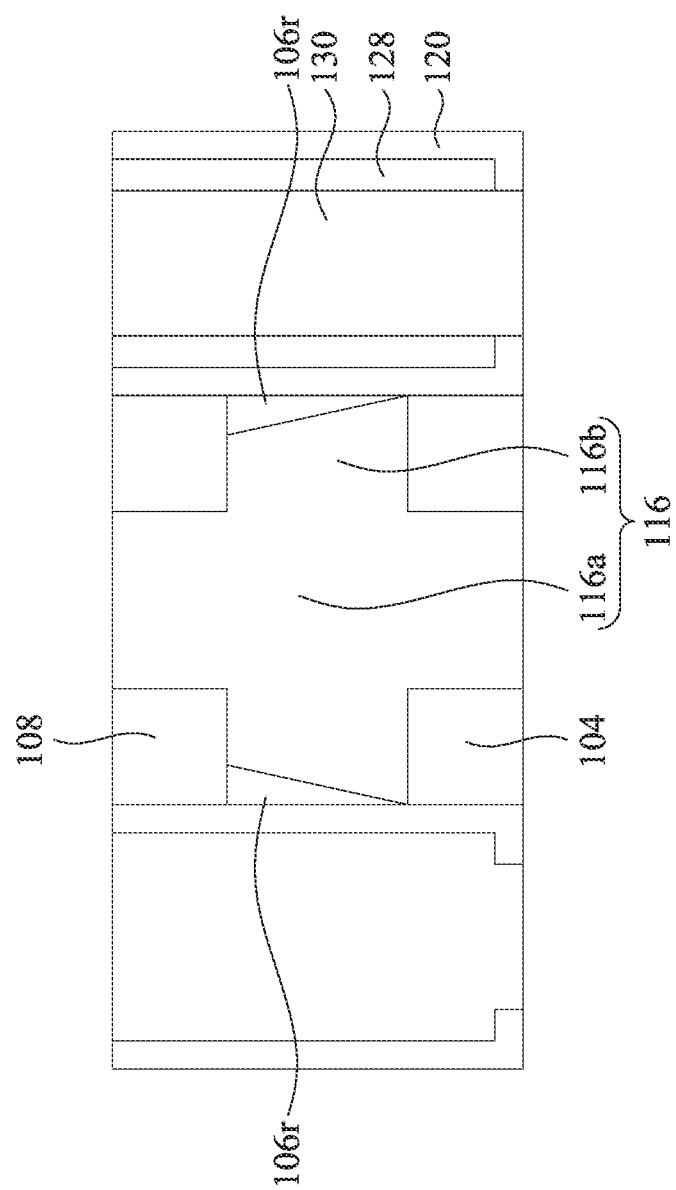

If the middle layer pull back process E2 etches an upper portion of the middle layer 106 at a slower etch rate than etching a lower portion of the middle layer 106, middle layer residues 106r with an inverted triangular cross-section may remain in memory cells as illustrated in FIG. 14. In greater detail, a middle layer residue (e.g., SiN residues) 106r may interpose the gate electrode 116b and the gate dielectric layer 120 and have a thickness increasing from a bottom of the residue 106r to a top of the residue 106r.

Figure 15:
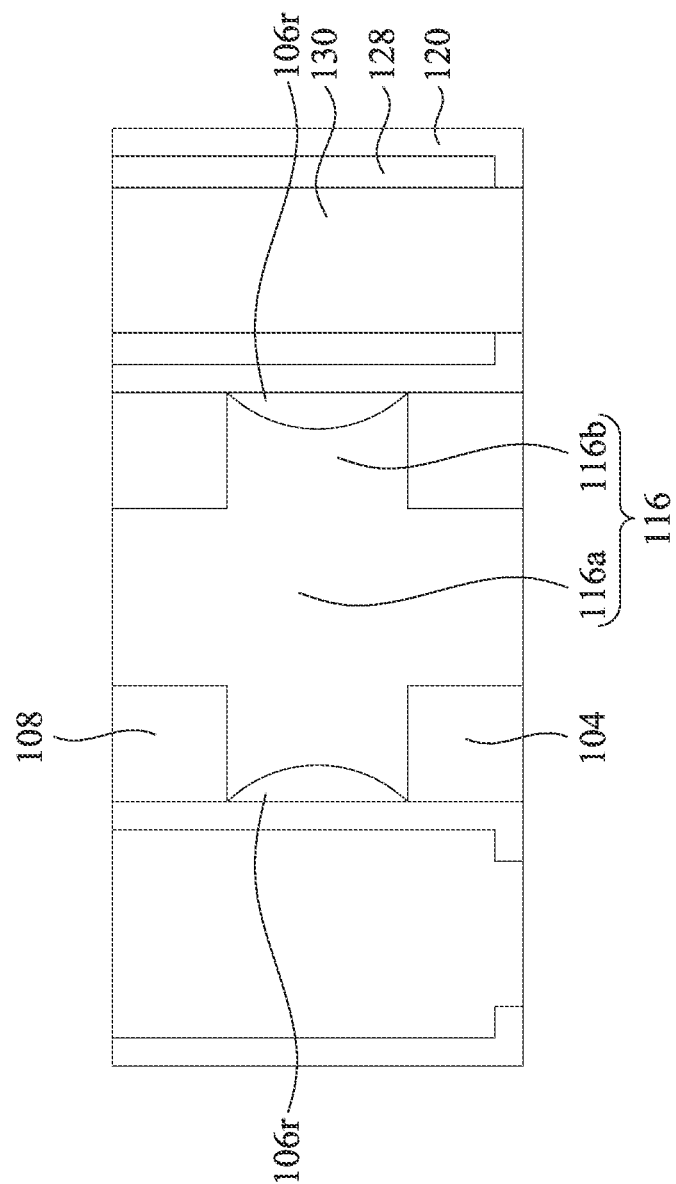

If the middle layer pull back process E2 etches a middle portion of the middle layer 106 at a slower etch rate than etching upper and lower portions of the middle layer 106, middle layer residues 106r with convex profile may remain in memory cells as illustrated in FIG. 15. In greater detail, a middle layer residue (e.g., SiN residues) 106r may interpose the gate electrode 116b and the gate dielectric layer 120 and have a thickness increasing from a bottom of the residue 106r to a middle of the residue 106r and then decreasing from the middle of the residue 106r to a top of the residue 106r.

Figure 16:
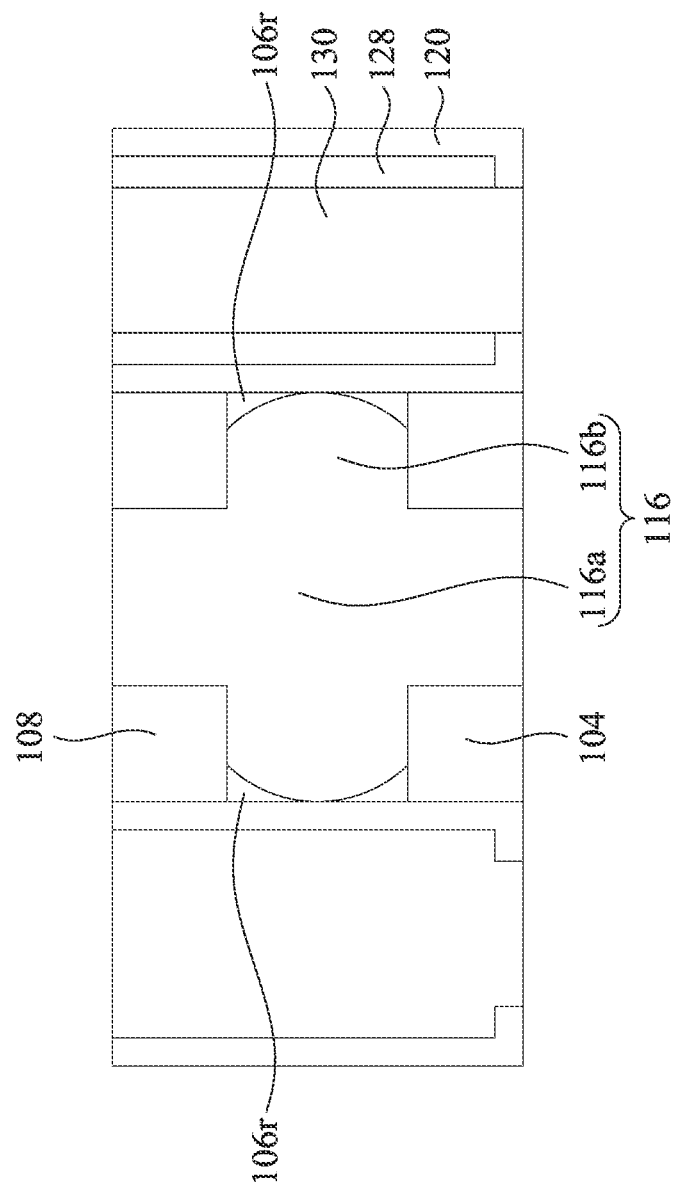

If the middle layer pull back process E2 etches a middle portion of the middle layer 106 at a faster etch rate than etching upper and lower portions of the middle layer 106, middle layer residues 106r with concave profile may remain in memory cells as illustrated in FIG. 16. In greater detail, a middle layer residue (e.g., SiN residues) 106r may interpose the gate electrode 116b and the gate dielectric layer 120 and have a thickness decreasing from a bottom of the residue 106r to a middle of the residue 106r and then increasing from the middle of the residue 106r to a top of the residue 106r.

FIGS. 17-18 illustrate cross-sectional views of a FRAM memory cell in accordance with various embodiments of the present disclosure. In some embodiments as illustrated in FIG. 17, the top dielectric layer (e.g., silicon oxide) 108 has a greater thickness than the bottom dielectric layer (e.g., silicon oxide) 104, and thus the word line 116 forms a larger interface with the top dielectric layer 108 than with the bottom dielectric layer 104. In some embodiments as illustrated in FIG. 18, the top dielectric layer (e.g., silicon oxide) 108 has a smaller thickness than the bottom dielectric layer (e.g., silicon oxide) 104, and thus the word line 116 forms a smaller interface with the top dielectric layer 108 than with the bottom dielectric layer 104.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that the memory cell current can be increased without enlarging the memory cell footprint, because the channel length extends in vertical direction. Another advantage is that memory cell density can be increased, because memory cells in adjacent rows share a same source line and a same bit line.

In some embodiments, a method comprises forming a dielectric structure over a substrate, etching the dielectric structure to form a word line trench in the dielectric structure, forming a word line in the word line trench in the dielectric structure, etching the dielectric structure to form a channel trench in the dielectric structure, forming a gate dielectric layer and a channel layer lining a sidewall of the channel trench, forming a source line contacting a first sidewall portion of the channel layer, and forming a resistance-switchable element contacting a second sidewall portion of the channel layer. In some embodiments, the method further comprises laterally expanding a middle portion of the word line trench before forming the word line in the word line trench. In some embodiments, after laterally expanding the middle portion of the word line trench, a top portion and a bottom portion of the word line trench is narrower than the middle portion of the word line trench. In some embodiments, etching the channel trench is performed such that a sidewall of the word line is exposed in the channel trench. In some embodiments, forming the gate dielectric layer and the channel layer comprises conformally depositing a layer of gate dielectric material in the channel trench, conformally depositing a layer of semiconductor material over the layer of gate dielectric material, and performing an anisotropic etching process to remove horizontal portions of the layer of semiconductor material and horizontal portions of the layer of gate dielectric material. In some embodiments, the method further comprises after forming the gate dielectric layer and the channel layer lining the sidewall of the channel trench, forming a dielectric filling structure filling the channel trench. Forming the source line comprises etching a first opening in the dielectric filling structure, and forming the source line in the first opening in the dielectric filling structure. In some embodiments, forming the resistance-switchable element comprises etching a second opening in the dielectric filling structure, and forming the resistance-switchable element in the second opening in the dielectric filling structure. In some embodiments, forming the resistance-switchable element in the second opening in the dielectric filling structure comprises conformally depositing a first layer of metal in the second opening in the dielectric filling structure, conformally depositing a layer of ferroelectric material over the first layer of metal, and depositing a second layer of metal over the layer of ferroelectric material. In some embodiments, a CMP process is performed on the second layer of metal, the layer of ferroelectric material, and the first layer of metal at least until the word line is exposed. In some embodiments, the method further comprises forming a first via on the source line and a second via on the resistance-switchable element.

In some embodiments, a method comprises forming a tri-layer dielectric stack over a substrate, the tri-layer dielectric stack comprising a bottom layer, a top layer, and a middle layer interposing the bottom layer and the top layer; performing a first etching process to form a word line trench in the tri-layer dielectric stack; performing a second etching process that selectively etches the middle layer to form recesses between the top layer and the bottom layer; forming a word line in the word line trench and the recesses; forming a gate dielectric layer on a sidewall of the word line, and a channel layer on a sidewall of the gate dielectric layer; and forming a source line on a first region of a sidewall of the channel layer, and a metal-ferroelectric-metal (MFM) structure on a second region of the sidewall of the channel layer. In some embodiments, the middle layer is formed of a material different from the top layer and/or the bottom layer. In some embodiments, the method further comprises after forming the word line, performing a third etching process to form a channel trench in the tri-layer dielectric stack. The gate dielectric layer and the channel layer are formed in the channel trench. In some embodiments, the channel trench runs parallel to the word line. In some embodiments, after the channel layer is formed in the channel trench, the source line and the MFM structure are formed in separate regions in the channel trench.

In some embodiments, a memory device comprises a word line, a gate dielectric layer, a semiconductor layer, a source line, and a resistance-switchable element. The word line is over a substrate. The gate dielectric layer is on a sidewall of the word line. The semiconductor layer is on a sidewall of the gate dielectric layer. The source line is in contact with a first region of a sidewall of the semiconductor layer. The resistance-switchable element is in contact with a second region of the sidewall of the semiconductor layer. In some embodiments, the resistance-switchable element comprises an outer electrode in contact with the second region of the sidewall of the semiconductor layer, a ferroelectric layer peripherally enclosed by the outer electrode, and an inner electrode peripherally enclosed by the ferroelectric layer. In some embodiments, an interface formed by the resistance-switchable element and the semiconductor layer is perpendicular to the substrate, and an interface formed by the source line and the resistance-switchable element is perpendicular to the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dielectric structure over a substrate;
   etching the dielectric structure to form a word line trench in the dielectric structure;
   forming a word line in the word line trench in the dielectric structure;
   etching the dielectric structure to form a channel trench in the dielectric structure;
   forming a gate dielectric layer and a channel layer lining a sidewall of the channel trench, wherein the gate dielectric layer extends from a position below a bottom end of the channel layer to a top end of the channel layer;
   forming a source line contacting a first sidewall portion of the channel layer; and
   forming a resistance-switchable element contacting a second sidewall portion of the channel layer.

2. The method of claim 1, further comprising:
   laterally expanding a middle portion of the word line trench before forming the word line in the word line trench.

3. The method of claim 2, wherein after laterally expanding the middle portion of the word line trench, a top portion and a bottom portion of the word line trench are narrower than the middle portion of the word line trench.

4. The method of claim 1, wherein etching the channel trench is performed such that a sidewall of the word line is exposed in the channel trench.

5. The method of claim 1, wherein forming the gate dielectric layer and the channel layer comprises:
   conformally depositing a layer of gate dielectric material in the channel trench;
   conformally depositing a layer of semiconductor material over the layer of gate dielectric material; and
   performing an anisotropic etching process to remove horizontal portions of the layer of semiconductor material and horizontal portions of the layer of gate dielectric material.

6. The method of claim 1, further comprising:
after forming the gate dielectric layer and the channel layer lining the sidewall of the channel trench, forming a dielectric filling structure filling the channel trench, wherein forming the source line comprises:
etching a first opening in the dielectric filling structure; and
forming the source line in the first opening in the dielectric filling structure.

7. The method of claim 6, wherein forming the resistance-switchable element comprises:
etching a second opening in the dielectric filling structure; and
forming the resistance-switchable element in the second opening in the dielectric filling structure.

8. The method of claim 7, wherein forming the resistance-switchable element in the second opening in the dielectric filling structure comprises:
conformally depositing a first layer of metal in the second opening in the dielectric filling structure;
conformally depositing a layer of ferroelectric material over the first layer of metal; and
depositing a second layer of metal over the layer of ferroelectric material.

9. The method of claim 8, wherein forming the resistance-switchable element in the second opening in the dielectric filling structure further comprises:
performing a chemical mechanical polish (CMP) process on the second layer of metal, the layer of ferroelectric material, and the first layer of metal at least until the word line is exposed.

10. The method of claim 1, further comprising:
forming a first via on the source line and a second via on the resistance-switchable element.

11. A method comprising:
forming a tri-layer dielectric stack over a substrate, the tri-layer dielectric stack comprising a bottom layer, a top layer, and a middle layer interposing the bottom layer and the top layer;
performing a first etching process to form a word line trench in the tri-layer dielectric stack;
performing a second etching process that selectively etches the middle layer to form recesses between the top layer and the bottom layer;
forming a word line in the word line trench and the recesses;
forming a gate dielectric layer on a sidewall of the word line, and a channel layer on a sidewall of the gate dielectric layer, the gate dielectric layer extending a height from a bottom surface of the bottom layer to a top surface of the top layer in the tri-layer dielectric stack; and
forming a source line on a first region of a sidewall of the channel layer, and a metal-ferroelectric-metal (MFM) structure on a second region of the sidewall of the channel layer.

12. The method of claim 11, wherein the middle layer is formed of a material different from the top layer.

13. The method of claim 11, wherein the middle layer is formed of a material from the bottom layer.

14. The method of claim 11, further comprising:
after forming the word line, performing a third etching process to form a channel trench in the tri-layer dielectric stack, wherein the gate dielectric layer and the channel layer are formed in the channel trench.

15. The method of claim 14, wherein the channel trench runs parallel to the word line.

16. The method of claim 14, wherein after the channel layer is formed in the channel trench, the source line and the MFM structure are formed in separate regions in the channel trench.

17. A method comprising:
forming a word line over a substrate;
forming a gate dielectric layer on a sidewall of the word line;
forming a semiconductor layer on a sidewall of the gate dielectric layer;
forming a source line in contact with a first region of a sidewall of the semiconductor layer; and
forming a resistance-switchable element in contact with a second region of the sidewall of the semiconductor layer, the resistance-switchable element having a bottom surface lower than a top surface of the semiconductor layer.

18. The method of claim 17, wherein forming the resistance-switchable element comprises:
forming an outer electrode in contact with the second region of the sidewall of the semiconductor layer;
forming a ferroelectric layer peripherally enclosed by the outer electrode; and
forming an inner electrode peripherally enclosed by the ferroelectric layer.

19. The method of claim 17, wherein an interface formed by the resistance-switchable element and the semiconductor layer is perpendicular to the substrate.

20. The method of claim 17, wherein an interface formed by the source line and the semiconductor layer is perpendicular to the substrate.

* * * * *